United States Patent
Ohsawa et al.

(10) Patent No.: US 10,141,037 B2
(45) Date of Patent: Nov. 27, 2018

(54) MAGNETIC MEMORY DEVICE

(71) Applicant: Kabushiki Kaisha Toshiba, Minato-ku (JP)

(72) Inventors: Yuichi Ohsawa, Yokohama (JP);
Hiroaki Yoda, Kawasaki (JP);
Altansargai Buyandalai, Kawasaki (JP); Satoshi Shirotori, Yokohama (JP);
Mariko Shimizu, Nerima (JP);
Hideyuki Sugiyama, Kawasaki (JP);
Yushi Kato, Chofu (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/704,571

(22) Filed: Sep. 14, 2017

(65) Prior Publication Data
US 2018/0268888 A1 Sep. 20, 2018

(30) Foreign Application Priority Data
Mar. 17, 2017 (JP) .................. 2017-053612

(51) Int. Cl.
*G11C 11/16* (2006.01)
*H01L 43/08* (2006.01)
*H01L 43/02* (2006.01)

(52) U.S. Cl.
CPC .......... *G11C 11/165* (2013.01); *G11C 11/161* (2013.01); *H01L 43/02* (2013.01); *H01L 43/08* (2013.01)

(58) Field of Classification Search
CPC ..... H01L 27/224–27/226; H01L 43/02–43/08; G11C 11/00; G11C 8/00; G11C 11/1675; G11C 11/16
See application file for complete search history.

(56) References Cited

U.S. PATENT DOCUMENTS 6,900,490 B2  5/2005  Asao et al.
7,230,308 B2  6/2007  Iwata
(Continued)

FOREIGN PATENT DOCUMENTS

JP  2004-296869 A  10/2004
JP  2006-165327 A  6/2006
(Continued)

OTHER PUBLICATIONS

Shunsuke Fukami, et al., "A sub-ns three-terminal spin-orbit torque induced switching device". IEEE Symposium on VLSI Technology Digest of Technical Papers, Jun. 14, 2016, 2 Pages.
(Continued)

*Primary Examiner* — Hien Nguyen
(74) *Attorney, Agent, or Firm* — Oblon, McClelland, Maier & Neustadt, L.L.P.

(57) ABSTRACT

According to one embodiment, a magnetic memory device includes a conductive layer, a first magnetic layer, a second magnetic layer, a first nonmagnetic layer, and a controller. The conductive layer includes a first portion, a second portion, and a third portion. The first magnetic layer is separated from the third portion. The first nonmagnetic layer is provided between the first magnetic layer and the second magnetic layer that is electrically connected with the third portion. The first nonmagnetic layer is curved. The controller is electrically connected to the first portion and the second portion. The controller implements a first operation and a second operation. The controller in the first operation supplies a first current to the conductive layer from the first portion toward the second portion. The controller in the second operation supplies a second current to the conductive layer from the second portion toward the first portion.

25 Claims, 25 Drawing Sheets

(56) References Cited

U.S. PATENT DOCUMENTS

| | | | |
|---|---|---|---|
| 9,082,497 B2 | 7/2015 | Suzuki | |
| 9,218,864 B1 | 12/2015 | Yi et al. | |
| 2004/0109264 A1* | 6/2004 | Gill | B82Y 10/00 360/324.2 |
| 2010/0084724 A1 | 4/2010 | Dimitrov et al. | |
| 2013/0062714 A1 | 3/2013 | Zhu et al. | |
| 2013/0250661 A1 | 9/2013 | Sandhu et al. | |
| 2014/0056060 A1 | 2/2014 | Khvalkovskiy et al. | |
| 2014/0119111 A1 | 5/2014 | Nakamura et al. | |
| 2014/0159121 A1* | 6/2014 | Fukami | H01L 43/08 257/252 |
| 2014/0269036 A1* | 9/2014 | Pi | G11C 11/1675 365/158 |
| 2015/0085569 A1 | 3/2015 | Nozaki et al. | |
| 2016/0225423 A1 | 8/2016 | Naik et al. | |
| 2017/0076769 A1 | 3/2017 | Shirotori et al. | |
| 2018/0004357 A1 | 1/2018 | Elsherbini et al. | |
| 2018/0040357 A1 | 2/2018 | Shirotori et al. | |
| 2018/0090671 A1* | 3/2018 | Kato | H01L 43/08 |
| 2018/0174634 A1* | 6/2018 | Kato | G11C 11/15 |

FOREIGN PATENT DOCUMENTS

| | | |
|---|---|---|
| JP | 2013-45840 A | 3/2013 |
| JP | 2014-45196 A | 3/2014 |
| JP | 2014-86640 A | 5/2014 |
| JP | 5486731 B2 | 5/2014 |
| JP | 2014-530487 A | 11/2014 |
| JP | 2017-59594 A | 3/2017 |
| JP | 2018-22806 A | 2/2018 |
| WO | WO 2013/027479 A1 | 2/2013 |
| WO | WO 2016/021468 A1 | 2/2016 |

OTHER PUBLICATIONS

P.W. Bridgman, "The Effect of Tension on the Electrical Resistance of Certain Abnormal Metals", Proceedings of the American Academy of Arts and Sciences, vol. 57 No. 3, Apr. 1922, pp. 41-66 with cover page.

* cited by examiner

US 10,141,037 B2

MAGNETIC MEMORY DEVICE

CROSS-REFERENCE TO RELATED APPLICATIONS

This application is based upon and claims the benefit of priority from Japanese Patent Application No. 2017-053612, filed on Mar. 17, 2017; the entire contents of which are incorporated herein by reference.

FIELD

Embodiments described herein relate generally to a magnetic memory device.

BACKGROUND

Stable operations of a magnetic memory device are desirable.

DETAILED DESCRIPTION

Figure 1A:
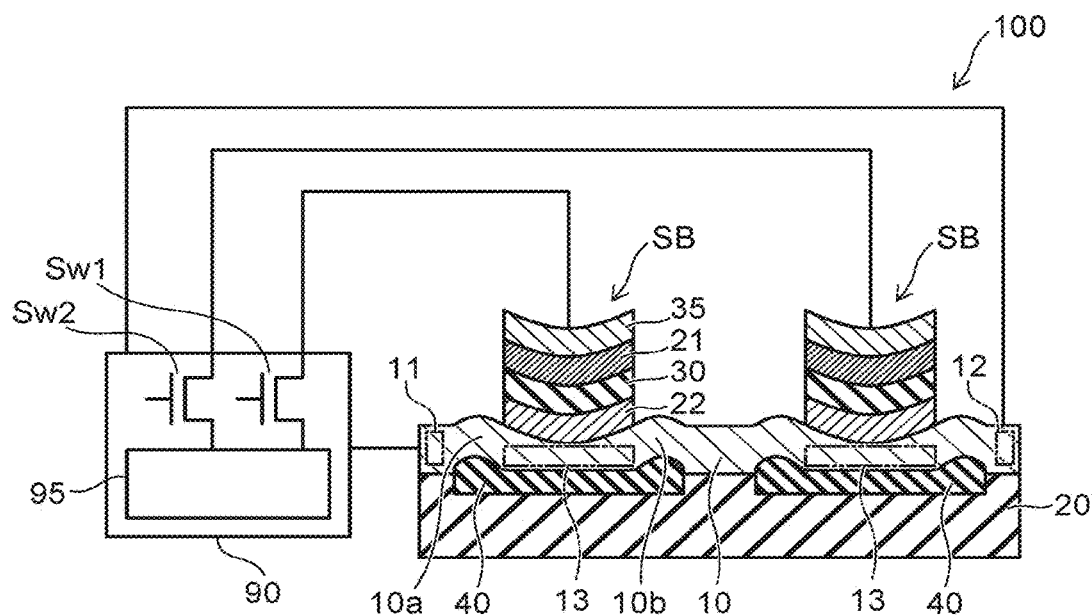
FIG. 1A and FIG. 1B are cross-sectional views illustrating a magnetic memory device according to a first embodiment.

According to one embodiment, a magnetic memory device includes a conductive layer, a first magnetic layer, a second magnetic layer, a first nonmagnetic layer, and a controller. The conductive layer includes a first portion, a second portion, and a third portion between the first portion and the second portion. The first magnetic layer is separated from the third portion in a second direction crossing a first direction. The first direction is from the first portion toward the second portion. The second magnetic layer is provided between the third portion and the first magnetic layer. The second magnetic layer being electrically connected with the third portion. The first nonmagnetic layer is provided between the first magnetic layer and the second magnetic layer. The first nonmagnetic layer is curved. The controller is electrically connected to the first portion and the second portion. The controller implements a first operation and a second operation. The controller in the first operation supplies a first current to the conductive layer from the first portion toward the second portion. The controller in the second operation supplies a second current to the conductive layer from the second portion toward the first portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

Figure 1B:
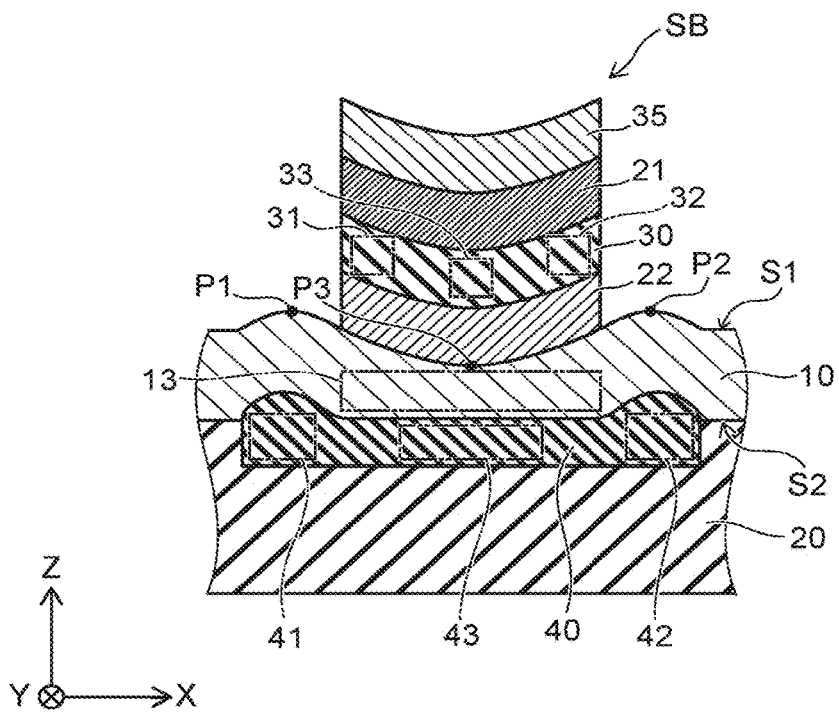

FIG. 1A and FIG. 1B are cross-sectional views illustrating a magnetic memory device according to a first embodiment.

FIG. 1B is a cross-sectional view in which a portion of FIG. 1A is enlarged.

The magnetic memory device 100 illustrated in FIGS. 1A and 1B includes a conductive layer 10, a first magnetic layer 21, a second magnetic layer 22, a first nonmagnetic layer 30, a first compound layer 40, and a controller 90.

The conductive layer 10 includes a first portion 11, a second portion 12, and a third portion 13. The third portion 13 is provided between the first portion 11 and the second portion 12. The conductive layer 10 includes a metallic element.

The direction from the first portion 11 toward the second portion 12 is taken as a first direction. For example, the first direction is aligned with an X-axis direction illustrated in FIGS. 1A and 1B. One direction perpendicular to the X-axis direction is taken as a Y-axis direction. A direction perpendicular to the X-axis direction and the Y-axis direction is taken as a Z-axis direction. A direction that crosses the first direction is taken as a second direction. For example, the second direction is aligned with the Z-axis direction. A direction that crosses the first direction and the second direction is taken as a third direction. For example, the third direction is aligned with the Y-axis direction.

The case will now be described where the first direction, the second direction, and the third direction are respectively aligned with the X-axis direction, the Z-axis direction, and the Y-axis direction.

The first magnetic layer 21 is separated from the third portion 13 in the Z-axis direction. The second magnetic layer 22 is provided between the third portion 13 and the first magnetic layer 21. The first nonmagnetic layer 30 is provided between the first magnetic layer 21 and the second magnetic layer 22. The first magnetic layer 21, the second magnetic layer 22, and the first nonmagnetic layer 30 are provided between the third portion 13 and an electrode 35.

At least a portion of the third portion 13 is provided between at least a portion of the first compound layer 40 and at least a portion of the second magnetic layer 22 in the Z-axis direction. At least a portion of the first compound layer 40 is provided between a portion of a base layer 20 and at least a portion of the third portion 13 in the Z-axis direction.

The controller 90 is electrically connected to the first portion 11 and the second portion 12. The controller 90 implements a first operation and a second operation. In the first operation, the controller 90 supplies a first current to the conductive layer 10 from the first portion 11 toward the second portion 12. In the second operation, the controller 90 supplies a second current to the conductive layer 10 from the second portion 12 toward the first portion 11. The first operation and the second operation correspond to a program operation.

The conductive layer 10 includes a first partial region 10a and a second partial region 10b. The first partial region 10a is positioned between the first portion 11 and the third portion 13. The second partial region 10b is positioned between the second portion 12 and the third portion 13. The first partial region 10a and the second partial region 10b do not overlap the second magnetic layer 22 in the Z-axis direction. A position of the second magnetic layer 22 in the X-axis direction is between a position of the first partial region 10a in the X-axis direction and a position of the second partial region 10b in the X-axis direction. In the first operation, the first current flows in the first partial region 10a and the second partial region 10b from the first portion 11 toward the second portion 12. In the second operation, the second current flows in the first partial region 10a and the second partial region 10b from the second portion 12 toward the first portion 11.

The first nonmagnetic layer 30 is curved. The first nonmagnetic layer 30 is, for example, bent. The position in the Z-axis direction of a portion of the first nonmagnetic layer 30 is different from the position in the Z-axis direction of another portion of the first nonmagnetic layer 30. For example, the first magnetic layer 21, the second magnetic layer 22, and the electrode 35 are curved along the first nonmagnetic layer 30.

According to the embodiment, the error rate can be reduced in the program operation and the read operation of the magnetic memory device 100. This is based on the curve of the first nonmagnetic layer 30 causing an increase of the voltage effect when a voltage is applied to the first nonmagnetic layer 30. According to the embodiment, a magnetic recording device can be provided in which the operations can be stabilized.

The magnetic memory device 100 according to the first embodiment will now be described in detail.

The length in the Z-axis direction of the first compound layer 40 changes in the X-axis direction. The first compound layer 40 includes a first region 41, a second region 42, and a third region 43. The third region 43 is provided between the first region 41 and the second region 42 in the X-axis direction. The length in the Z-axis direction of the third region 43 is, for example, shorter than the length in the Z-axis direction of the first region 41 and shorter than the length in the Z-axis direction of the second region 42.

The length in the X-axis direction of the first compound layer 40 is, for example, longer than the length in the X-axis direction of the first nonmagnetic layer 30. The position in the X-axis direction of at least a portion of the first nonmagnetic layer 30 is between the position in the X-axis direction of the first region 41 and the position in the X-axis direction of the second region 42.

In the example illustrated in FIGS. 1A and 1B, a portion of the first compound layer 40 is provided between a portion of the conductive layer 10 and another portion of the conductive layer 10 in the X-axis direction. Another portion of the first compound layer 40 is provided between a portion of the base layer 20 and another portion of the base layer 20 in the X-axis direction.

The conductive layer 10 has a first surface S1 and a second surface S2. A portion of the first surface S1 is provided between the second magnetic layer 22 and a portion of the second surface S2. A portion of the second surface S2 is provided between the first compound layer 40 and a portion of the first surface S1.

The first surface S1 includes a first point P1, a second point P2, and a third point P3. The position in the X-axis direction of the third point P3 is between the position in the X-axis direction of the first point P1 and the position in the X-axis direction of the second point P2. The direction from the first region 41 toward the first point P1, the direction from the second region 42 toward the second point P2, and the direction from the third region 43 toward the third point P3 each are aligned with the Z-axis direction.

The position in the Z-axis direction of the third point P3 is, for example, between the position in the Z-axis direction of the first point P1 and the position in the Z-axis direction of the first compound layer 40 and between the position in the Z-axis direction of the second point P2 and the position in the Z-axis direction of the first compound layer 40.

The first nonmagnetic layer 30 includes a first nonmagnetic region 31, a second nonmagnetic region 32, and a third nonmagnetic region 33. The position in the X-axis direction of the third nonmagnetic region 33 is between the position in the X-axis direction of the first nonmagnetic region 31 and the position in the X-axis direction of the second nonmagnetic region 32.

The position in the Z-axis direction of at least a portion of the third nonmagnetic region 33 is different from the position in the Z-axis direction of at least a portion of the first nonmagnetic region 31 and the position in the Z-axis direction of at least a portion of the second nonmagnetic region 32. The position in the Z-axis direction of the third nonmagnetic region 33 is, for example, between the position in the Z-axis direction of the first nonmagnetic region 31 and the position in the Z-axis direction of the conductive layer 10 and between the position in the Z-axis direction of the second nonmagnetic region 32 and the position in the Z-axis direction of the conductive layer 10.

The direction from the third nonmagnetic region 33 toward the third point P3 is aligned with the Z-axis direction. The position in the X-axis direction of the first nonmagnetic region 31 is, for example, between the position in the X-axis direction of the first point P1 and the position in the X-axis direction of the third point P3. Or, the direction from the first point P1 toward the first nonmagnetic region 31 may be aligned with the Z-axis direction. The position in the X-axis direction of the second nonmagnetic region 32 is, for example, between the position in the X-axis direction of the second point P2 and the position in the X-axis direction of the third point P3. Or, the direction from the second point P2 toward the second nonmagnetic region 32 may be aligned with the Z-axis direction.

In the example illustrated in FIGS. 1A and 1B, the magnetic memory device 100 includes multiple stacked bodies SB and multiple first compound layers 40. The conductive layer 10 includes multiple third portions 13. The multiple stacked bodies SB are separated from each other in the X-axis direction. The multiple first compound layers 40 are separated from each other in the X-axis direction. The multiple third portions 13 are provided respectively between the multiple stacked bodies SB and the multiple first compound layers 40 in the Z-axis direction. The first magnetic layer 21, the second magnetic layer 22, and the first nonmagnetic layer 30 are curved in each of the stacked bodies SB.

The stacked body SB functions as, for example, a magnetic variable resistance element. The electrical resistance value of a path including the first magnetic layer 21, the first nonmagnetic layer 30, and the second magnetic layer 22 changes according to the relative relationship between the orientation of the magnetization of the first magnetic layer 21 and the orientation of the magnetization of the second magnetic layer 22. For example, the first nonmagnetic layer 30 is insulative; and the stacked body SB has a magnetic tunnel junction. The first magnetic layer 21 functions as, for example, a reference layer. The second magnetic layer 22 functions as, for example, a memory layer.

A first state in which the magnetization of the second magnetic layer 22 is oriented in one direction corresponds to first information to be stored. A second state in which the magnetization of the second magnetic layer 22 is oriented in another direction corresponds to second information to be stored. The first information corresponds to, for example, one of "0" or "1." The second information corresponds to the other of "0" or "1."

For example, the orientation of the magnetization of the second magnetic layer 22 can be controlled by the orientation of the current flowing through the conductive layer 10. The conductive layer 10 functions as, for example, a spin orbit layer (SOL). For example, the orientation of the magnetization of the second magnetic layer 22 can be changed by the spin-orbit torque generated between the conductive layer 10 and the second magnetic layer 22. The spin-orbit torque is based on the current flowing in the conductive layer 10.

The current is supplied by the controller 90. The controller 90 includes, for example, a drive circuit 95 and multiple switch elements Sw (Sw1 and Sw2). The controller 90 is electrically connected to the first portion 11, the second portion 12, and the multiple first magnetic layers 21. The multiple switch elements Sw are provided respectively in the current paths between the drive circuit 95 and the multiple first magnetic layers 21.

In a first operation (a first program operation), the controller 90 supplies the first current to the conductive layer 10. Thereby, a first state is formed. The first current flows from the first portion 11 toward the second portion 12. In a second operation, the controller 90 supplies a second current to the conductive layer 10. Thereby, a second state is formed. The second current flows from the second portion 12 toward the first portion 11.

For example, a first electrical resistance value between the first magnetic layer 21 and the first portion 11 after the first operation (the first state) is different from a second electrical resistance value between the first magnetic layer 21 and the first portion 11 after the second operation (the second state). The difference of the electrical resistance values is based on, for example, the difference of the orientation of the magnetization of the second magnetic layer 22 between the first state and the second state.

In a read operation, the controller 90 senses, for example, a characteristic (which may be a voltage, a current, etc.) corresponding to the electrical resistance value between the first magnetic layer 21 and the first portion 11.

One of the multiple stacked bodies SB is selected by the operations of the multiple switch elements Sw. The program operation and the read operation of the selected stacked body SB can be performed. When the one of the multiple stacked bodies SB is selected, a prescribed select voltage is applied to the first magnetic layer 21 of the stacked body SB. At this time, an unselect voltage is applied to the other stacked bodies SB. The potential of the select voltage is different from the potential of the unselect voltage. As long as the potential of the select voltage is different from the potential of the unselect voltage, the select voltage may be 0 volts.

If the first nonmagnetic layer 30 is curved, the voltage effect of the first nonmagnetic layer 30 can be increased when applying the select voltage to the first magnetic layer 21. As a result, unintended programming and reading of information to and from the second magnetic layer 22 of the unselected stacked bodies SB are suppressed. Accordingly, according to the embodiment, the error rate in the program operation and the read operation can be reduced. According to the embodiment, a magnetic memory device can be provided in which the operations can be stabilized.

The conductive layer 10 may include a nonmagnetic material. The conductive layer 10 may be nonmagnetic. The conductive layer 10 includes, for example, at least one selected from the group consisting of tantalum and tungsten. The conductive layer 10 includes, for example, at least one selected from the group consisting of β-tantalum and β-tungsten. The spin Hall angle is negative for these materials. The absolute value of the spin Hall angle is large for these materials. Thereby, the orientation of the magnetization of the second magnetic layer 22 can be controlled efficiently by the program current.

The conductive layer 10 may include at least one selected from the group consisting of platinum and gold. The spin Hall angle is positive for these materials. The absolute value of the spin Hall angle is large for these materials. Thereby, the orientation of the magnetization of the second magnetic layer 22 can be controlled efficiently when supplying the first current and the second current.

The direction (the orientation) of the spin-orbit torque applied to the second magnetic layer 22 is different according to the polarity of the spin Hall angle. For example, the conductive layer 10 applies a spin-orbit interaction torque to the second magnetic layer 22.

The base layer 20 is, for example, insulative. The base layer 20 may be at least a portion of a substrate. The base layer 20 includes, for example, at least one selected from the group consisting of silicon oxide and aluminum oxide.

The first magnetic layer 21 includes, for example, Co (cobalt) or CoFeB (cobalt-iron-boron). For example, the orientation of the magnetization of the first magnetic layer 21 is aligned with an in-plane direction. The orientation of the magnetization of the first magnetic layer 21 does not change easily compared to the orientation of the magnetization of the second magnetic layer 22.

For example, the thickness of the first magnetic layer 21 is thicker than the thickness of the second magnetic layer 22. Thereby, the orientation of the magnetization of the first magnetic layer 21 does not change easily compared to the orientation of the magnetization of the second magnetic layer 22.

The first magnetic layer 21 may include, for example, first to third films. The first film is provided between the third film and the first nonmagnetic layer 30. The second film is provided between the first film and the third film. The first film includes, for example, a CoFeB film (having a thickness of, for example, not less than 1.5 nm and not more than 2.5 nm). The second film includes, for example, a Ru film (having a thickness of, for example, not less than 0.7 nm and not more than 0.9 nm). The third film includes, for example, a CoFeB film (having a thickness of, for example, not less than 1.5 nm and not more than 2.5 nm).

For example, a ferromagnetic layer may be provided. The first magnetic layer 21 is provided between the ferromagnetic layer and the first nonmagnetic layer 30. The ferromagnetic layer is, for example, an IrMn-layer (having a thickness of not less than 7 nm and not more than 9 nm). The orientation of the magnetization of the first magnetic layer 21 changes less easily due to the ferromagnetic layer. A Ta layer may be provided on the ferromagnetic layer.

The second magnetic layer 22 includes, for example, at least one of a ferromagnetic material or a soft magnetic material. The second magnetic layer 22 may include, for example, an artificial lattice.

The second magnetic layer 22 includes, for example, at least one selected from the group consisting of FePd (iron-palladium), FePt (iron-platinum), CoPd (cobalt-palladium), and CoPt (cobalt-platinum). The soft magnetic materials recited above include, for example, CoFeB (cobalt-iron-boron). The artificial lattices recited above include, for example, a stacked film including the first film and the second film. For example, the first film includes a magnetic material; and the second film includes a nonmagnetic material. The first film includes, for example, at least one of NiFe (nickel-iron), Fe (iron), or Co (cobalt). The second film includes, for example, at least one selected from the group consisting of Cu (copper), Pd (palladium), and Pt (platinum).

The second magnetic layer 22 may include a ferrimagnetic material.

In the example illustrated in FIGS. 1A and 1B, the orientation of the magnetization of the first magnetic layer 21 and the orientation of the magnetization of the second magnetic layer 22 are aligned with, for example, the X-axis direction. For example, this is based on the inverse magnetostrictive effect due to the curve of the first magnetic layer 21 and the second magnetic layer 22. For example, the second magnetic layer 22 obtains a polarized spin that is antiparallel to the magnetization direction from the conductive layer 10 when the current flows in the conductive layer 10. The second magnetic layer 22 may further include at least one of an in-plane shape magnetic anisotropy or an in-plane magneto-crystalline anisoconductivetropy.

The shapes of the first magnetic layer 21 and the second magnetic layer 22 when viewed from the Z-axis direction are, for example, circles, ellipses, or polygons. It is desirable for these shapes to be squares, rectangles, or parallelograms. By setting the shapes when viewed from the Z-axis direction to have sides that are orthogonal to each other, stress that has a larger in-plane anisotropy acts on the first magnetic layer 21 and the second magnetic layer 22; and the magnetic in-plane anisotropy can be large.

The first nonmagnetic layer 30 includes, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). The first nonmagnetic layer 30 is, for example, a tunneling barrier layer. In the case where the first nonmagnetic layer 30 includes MgO, the thickness of the first nonmagnetic layer 30 is, for example, about 1 nm.

The first compound layer 40 includes, for example, an insulative compound. In such a case, the first compound layer 40 includes, for example, an oxide of at least one element selected from the group consisting of aluminum, magnesium, tantalum, boron, calcium, silicon, germanium, gallium, indium, tungsten, titanium, copper, palladium, zirconium, yttrium, zinc, tin, and bismuth.

It is desirable for the electrical resistivity of the first compound layer 40 to be higher than the electrical resistivity of the conductive layer 10. In such a case, the current density of the third portion 13 when the current is caused to flow in the conductive layer 10 can be increased. Therefore, the first state and the second state can be formed using a smaller first current and a smaller second current. In the case where the first compound layer 40 is insulative, the first current and the second current can be reduced further.

The first compound layer 40 may include a conductive compound. In such a case, the first compound layer 40 includes at least one selected from the group consisting of iron-silicon, copper-silicon, aluminum-indium, nickel-silicon, cobalt-silicon, and copper-indium. The first compound layer 40 may include at least one selected from the group consisting of zinc, indium, gallium, tin, bismuth, silicon, and manganese, iron, copper, aluminum, nickel, and cobalt. The first compound layer 40 may include at least one selected from the group consisting of a first compound and a second compound. The first compound includes at least one first element selected from the group consisting of zinc, indium, gallium, tin, bismuth, silicon, and manganese. The second compound includes the first element and at least one selected from the group consisting of iron, copper, aluminum, nickel, and cobalt.

FIG. 2A, FIG. 2B, FIG. 3A, and FIG. 3B are cross-sectional views of processes, illustrating a method for manufacturing the magnetic memory device according to the first embodiment.

Figure 2A:
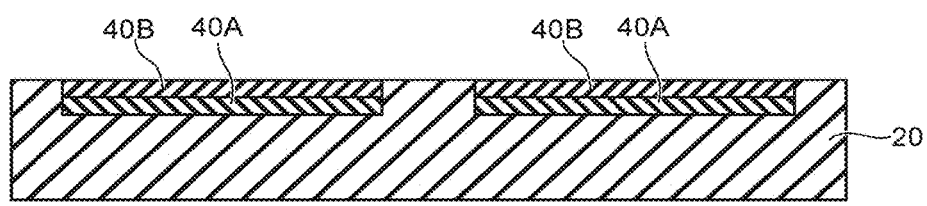
FIG. 2A, FIG. 2B, FIG. 3A, and FIG. 3B are cross-sectional views of processes, illustrating a method for manufacturing the magnetic memory device according to the first embodiment.

As illustrated in FIG. 2A, a film 40A is formed on the base layer 20. A film 40B is formed on the film 40A. At least a portion of the material included in the film 40A is different from at least a portion of the material included in the film 40B. The film 40A includes, for example, aluminum oxide. The film 40B includes, for example, an alloy of magnesium, aluminum, and boron. One or more other films may be formed. At least a portion of the material included in the other films is different from at least a portion of the material included in the film 40A and the film 40B. Or, another film may be formed between the film 40A and the film 40B. The film may include material same as at least a portion of the material included in the film 40A and include material same as at least a portion of the material included in the film 40B.

Figure 2B:
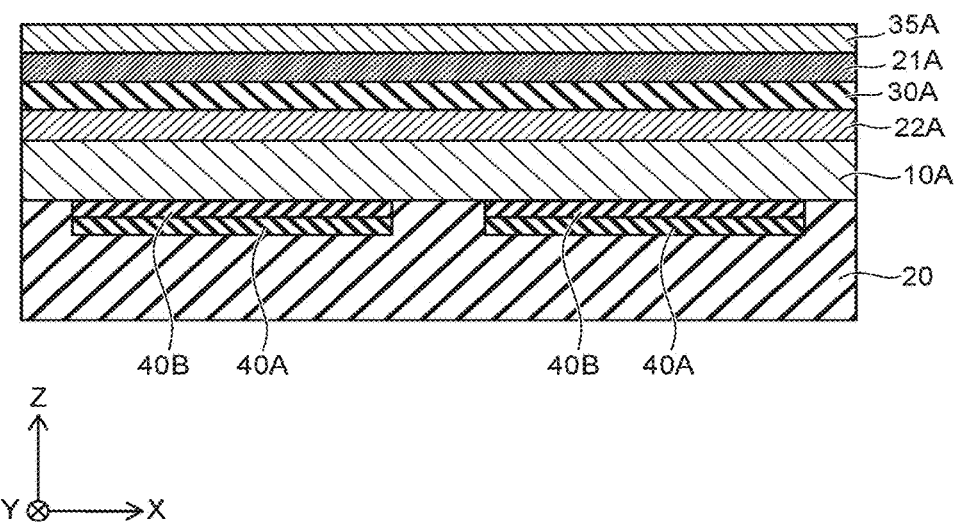

A conductive film 10A is formed on the base layer 20, the film 40A, and the film 40B. A magnetic film 22A is formed on the conductive film 10A. A nonmagnetic film 30A is formed on the magnetic film 22A. As illustrated in FIG. 2B, a magnetic film 21A is formed on the nonmagnetic film 30A. A metal film 35A is formed on the magnetic film 21A.

Figure 3A:
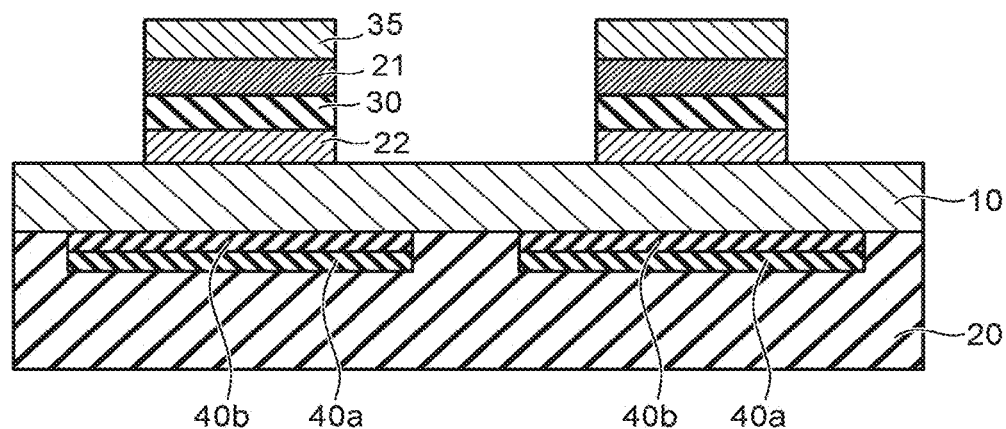

As illustrated in FIG. 3A, a portion of the metal film 35A, a portion of the magnetic film 21A, a portion of the nonmagnetic film 30A, a portion of the magnetic film 22A, a portion of the conductive film 10A, a portion of the film 40A, and a portion of the film 40B are removed. The conductive film 10A is divided in the Y-direction; and the conductive layer 10 is formed. The film 40A and the film 40B are divided in the Y-direction; and a layer 40a and a layer 40b are formed. On each of the conductive layers 10, the stacked bodies SB that are arranged in the X-axis direction are formed.

Figure 3B:
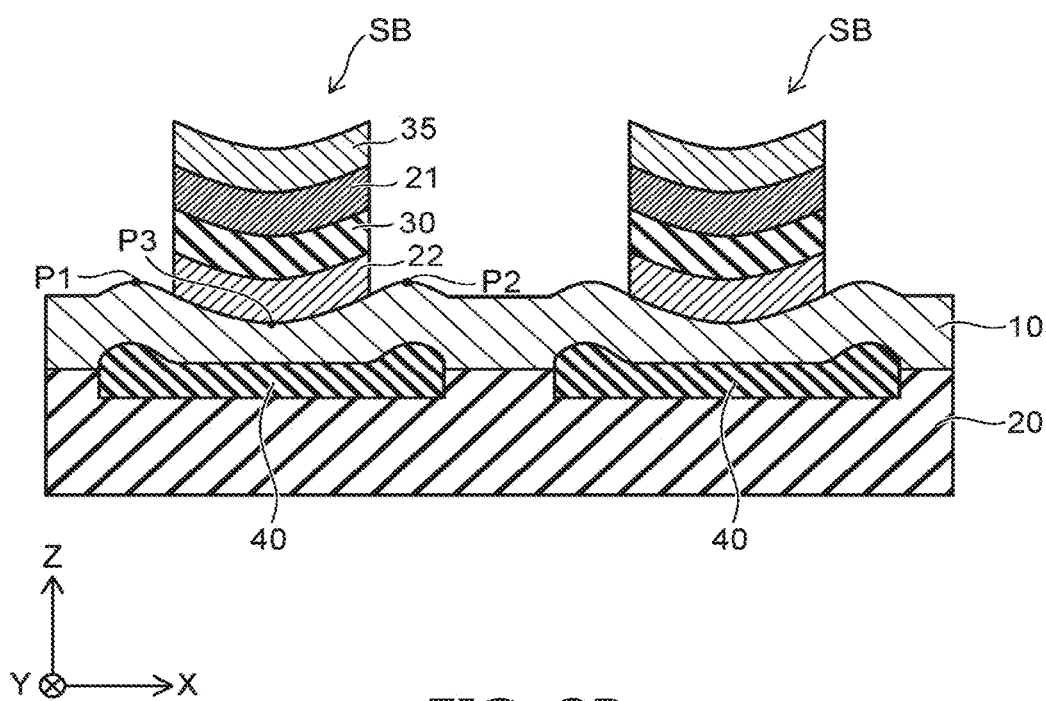

Heat is applied to the layer 40a and the layer 40b. As illustrated in FIG. 3B, the material included in the layer 40a and the material included in the layer 40b react; and the first compound layer 40 is formed. The volume of the first compound layer 40 is different from the sum of the volume of the layer 40a and the volume of the layer 40b. For example, the volume of the first compound layer 40 is larger than the sum of the volume of the layer 40a and the volume of the layer 40b.

Stress is applied to the conductive layer 10 due to the difference of the volume. The positions in the Z-axis direction of the first to third points P1 to P3 of the first surface S1 of the conductive layer 10 change due to the stress. As a result, a force is applied to the first magnetic layer 21, the second magnetic layer 22, and the first nonmagnetic layer 30; and these layers are curved.

As illustrated in FIG. 1A, the controller 90 is electrically connected to the first portion 11, the second portion 12, and the electrode 35. The magnetic memory device according to the first embodiment is made by the processes recited above.

It is desirable for the heating process of the layer 40a and the layer 40b to be performed after the formation of the stacked body SB. This is because it is easier to cause the first magnetic layer 21, the second magnetic layer 22, and the first nonmagnetic layer 30 to be curved.

The stacked body SB may be formed after a first compound film is formed by heating the film 40A and the film 40B. Or, the magnetic film 22A, the nonmagnetic film 30A, and the magnetic film 21A may be formed after forming the first compound film. In the method for manufacturing these components, a portion of the conductive film 10A and a portion of the first compound film are removed; and the stress of the conductive film 10A and the first compound film is released when forming the conductive layer 10 and the first compound layer 40. Thereby, the first magnetic layer 21, the second magnetic layer 22, and the first nonmagnetic layer 30 can be curved.

Only one of the film 40A or the film 40B may be formed in the processes for manufacturing the magnetic memory device according to the embodiment described above. In such a case, the material that is included in the one of the film 40A or the film 40B reacts with the metal material included in the conductive film 10A. Thereby, the first compound layer 40 is formed.

Figure 4:
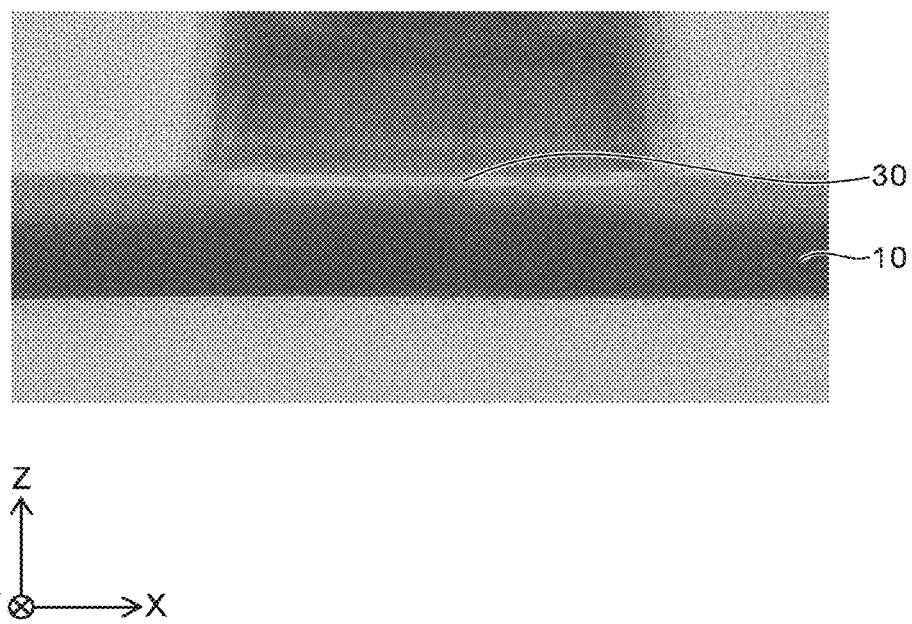
FIG. 4 is a cross-sectional photograph of a portion of the magnetic memory device according to the first embodiment.

FIG. 4 is a cross-sectional photograph of a portion of the magnetic memory device according to the first embodiment.

As illustrated in FIG. 4, the first nonmagnetic layer 30 is curved. Also, the surface of the conductive layer 10 crossing the Z-axis direction is curved.

FIG. 5A, FIG. 5B, FIG. 6A, and FIG. 6B are cross-sectional views illustrating portions of other magnetic memory devices according to the first embodiment.

Figure 5A:
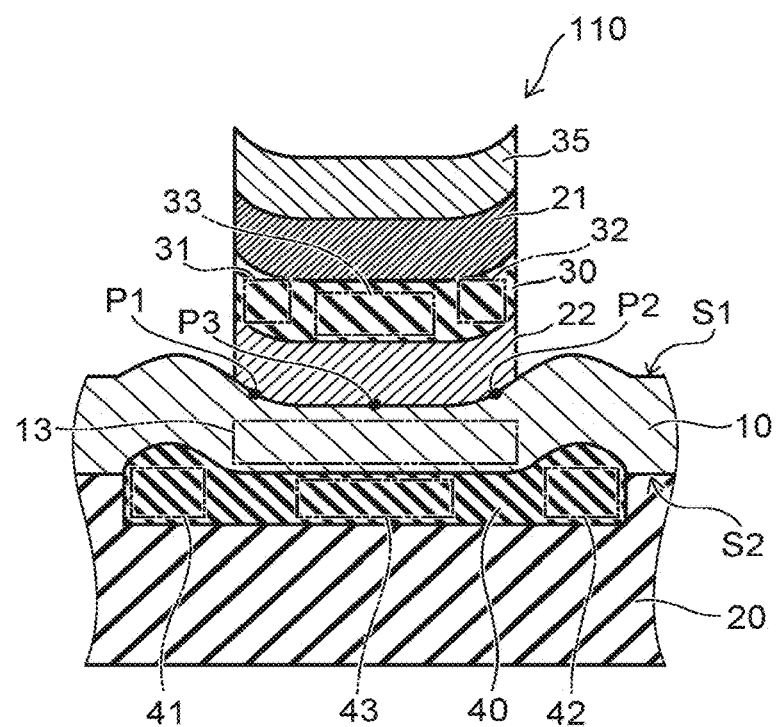
FIG. 5A, FIG. 5B, FIG. 6A, and FIG. 6B are cross-sectional views illustrating portions of other magnetic memory devices according to the first embodiment.

In a magnetic memory device 110 illustrated in FIG. 5A, the third nonmagnetic region 33 is aligned with the X-axis direction. The curvature at the third nonmagnetic region 33 vicinity is relatively small; and the curvatures at the first nonmagnetic region 31 vicinity and the second nonmagnetic region 32 vicinity are relatively large. Similarly, the curvatures at the two X-axis direction end vicinities are large for the first magnetic layer 21 and the second magnetic layer 22. The third nonmagnetic region 33 overlaps at least a portion of the second magnetic layer 22 in the X-axis direction.

Figure 5B:
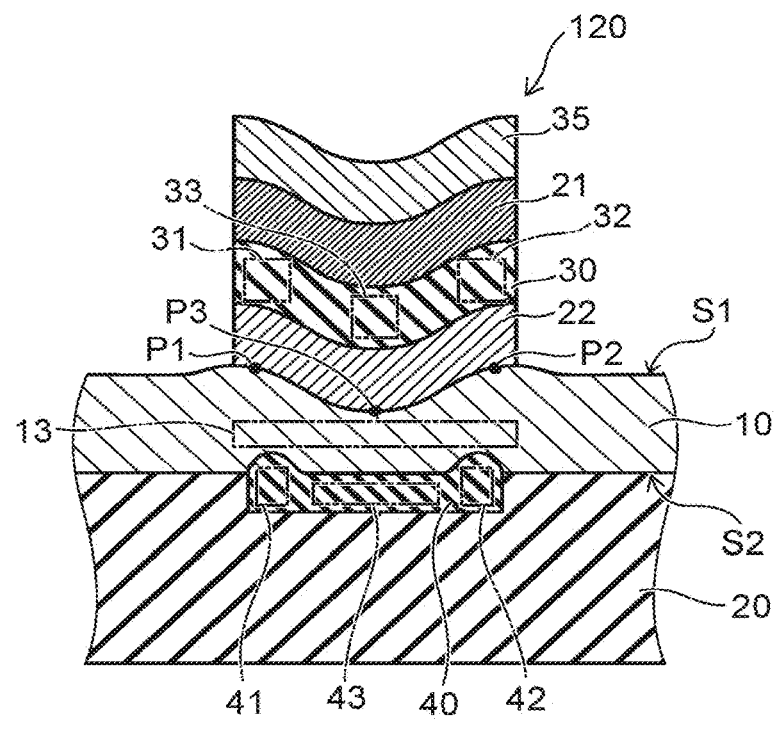

In a magnetic memory device 120 illustrated in FIG. 5B, the length in the X-axis direction of the first compound layer 40 is shorter than the length in the X-axis direction of the first nonmagnetic layer 30. The length in the X-axis direction of the first compound layer 40 may be the same as the length in the X-axis direction of the first nonmagnetic layer 30. The curvature at the third nonmagnetic region 33 vicinity is relatively small; and the curvatures at the first nonmagnetic region 31 vicinity and the second nonmagnetic region 32 vicinity are relatively large. Similarly, the curvature at the X-axis direction center vicinity is large for the first magnetic layer 21 and the second magnetic layer 22.

Figure 6A:
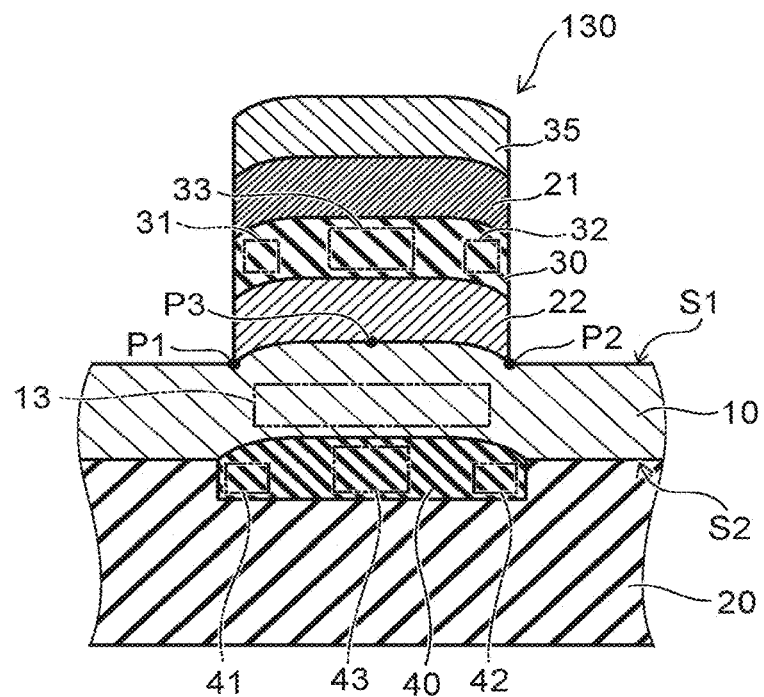
Figure 6B:
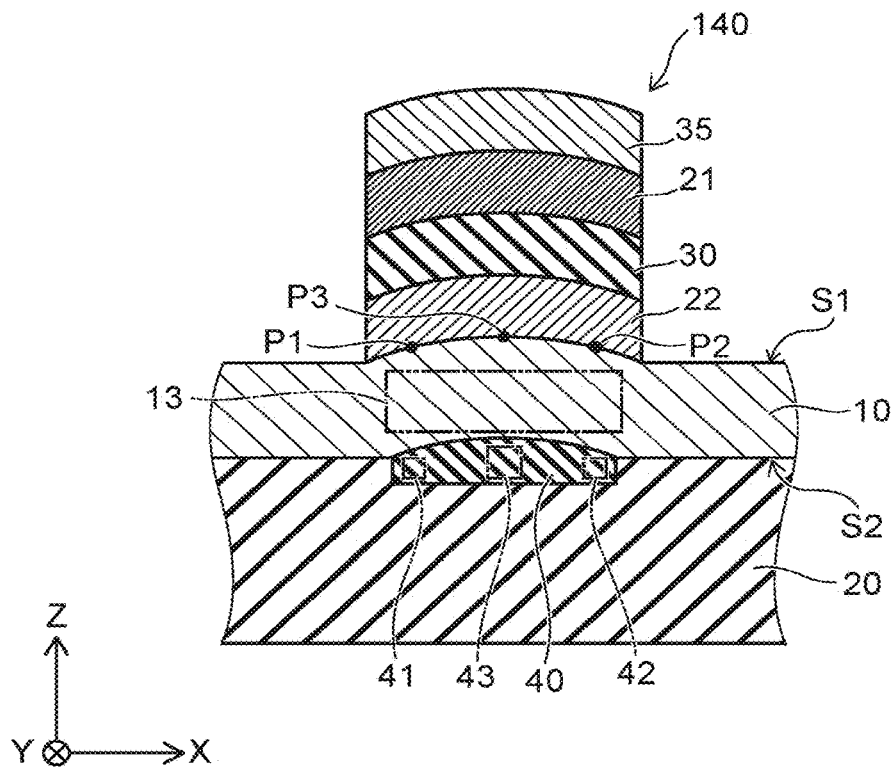
Figure 7A:
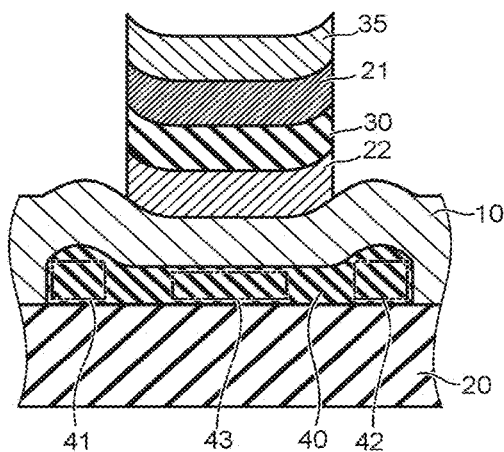
FIG. 7A to FIG. 7D are cross-sectional views illustrating portions of other magnetic memory devices according to the first embodiment.
Figure 7B:
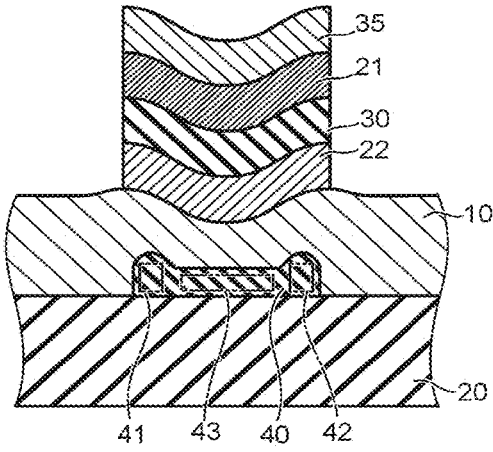
Figure 7C:
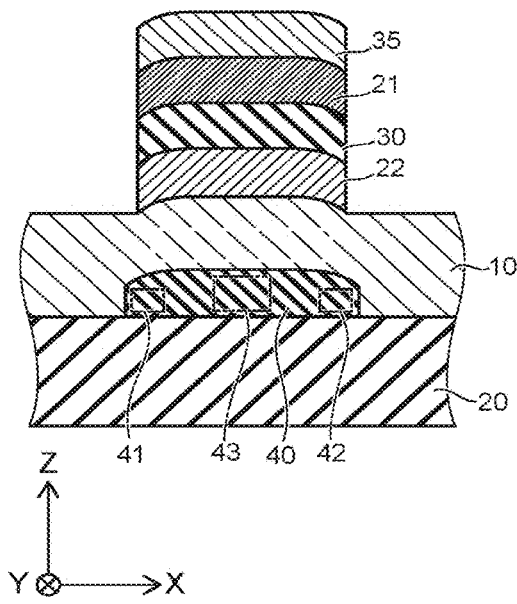
Figure 7D:
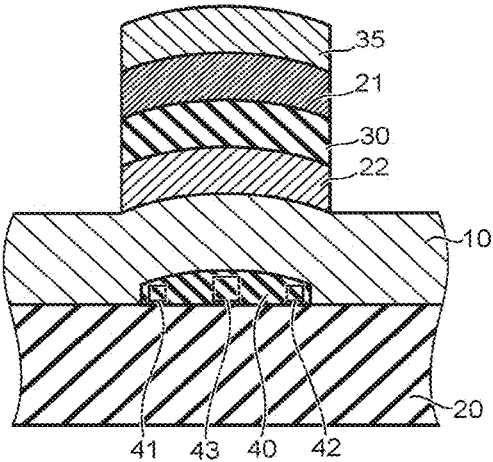
Figure 8A:
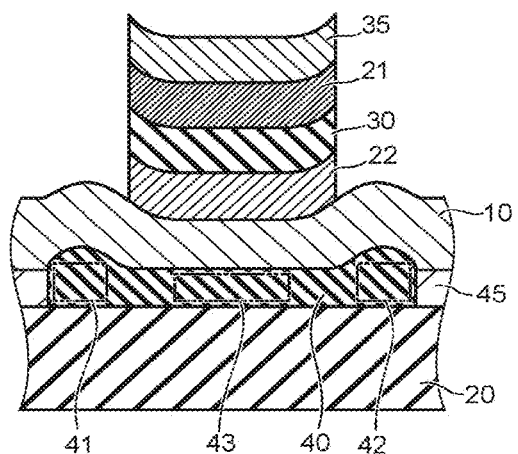
FIG. 8A to FIG. 8D are cross-sectional views illustrating portions of other magnetic memory devices according to the first embodiment.
Figure 8B:
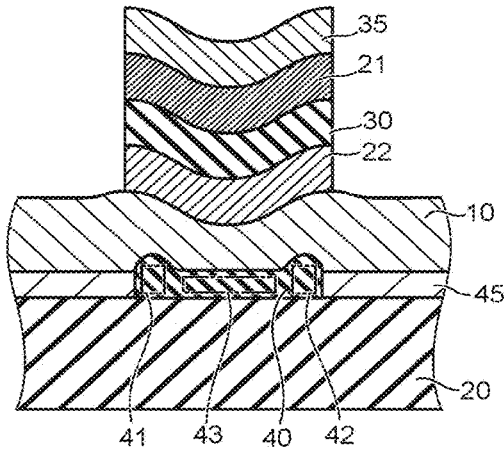
Figure 8C:
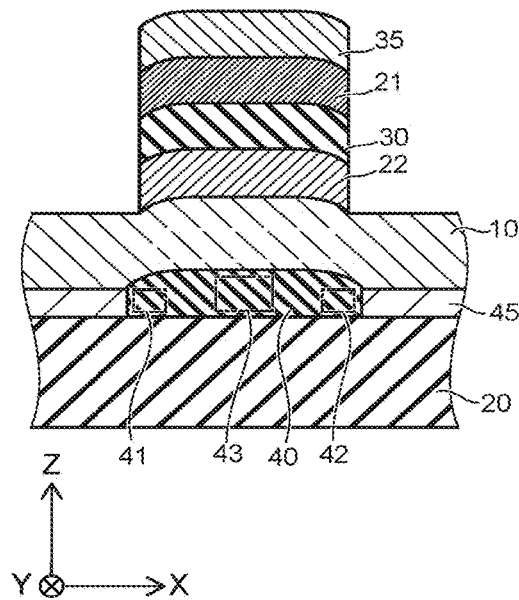
Figure 8D:
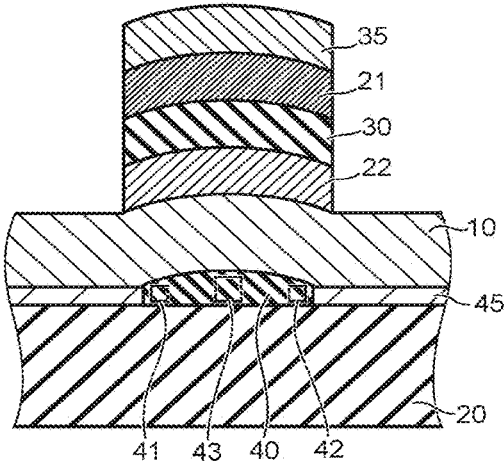

In the examples illustrated in FIG. 1A, FIG. 1B, FIG. 5A, and FIG. 5B, the first nonmagnetic layer 30 is curved to be convex downward. As illustrated in FIG. 6A and FIG. 6B, the first nonmagnetic layer 30 may be curved to be convex upward.

In magnetic memory devices 130 and 140 illustrated in FIG. 6A and FIG. 6B, the length in the Z-axis direction of the third region 43 is longer than the length in the Z-axis direction of the first region 41 and longer than the length in the Z-axis direction of the second region 42. The position in the Z-axis direction of the first point P1 and the position in the Z-axis direction of the second point P2 are between the position in the Z-axis direction of the third point P3 and the position in the Z-axis direction of the first compound layer 40. The position in the Z-axis direction of at least a portion of the first nonmagnetic region 31 and the position in the Z-axis direction of at least a portion of the second nonmagnetic region 32 are between the position in the Z-axis direction of at least a portion of the third nonmagnetic region 33 and the position in the Z-axis direction of the conductive layer 10. The third nonmagnetic region 33 overlaps at least a portion of the first magnetic layer 21 in the X-axis direction.

In the magnetic memory device 130, the length in the X-axis direction of the first compound layer 40 is longer than the length in the X-axis direction of the first nonmagnetic layer 30. The curvature at the third nonmagnetic region 33 vicinity is relatively small; and the curvatures at the first nonmagnetic region 31 vicinity and the second nonmagnetic region 32 vicinity are relatively large. Similarly, the curvatures at the two X-axis direction end vicinities are large for the first magnetic layer 21 and the second magnetic layer 22.

In the magnetic memory device 140, the length in the X-axis direction of the first compound layer 40 is shorter than the length in the X-axis direction of the first nonmagnetic layer 30. The length in the X-axis direction of the first compound layer 40 may be the same as the length in the X-axis direction of the first nonmagnetic layer 30. The curvature at the third nonmagnetic region 33 vicinity is substantially the same as the curvatures at the first nonmagnetic region 31 vicinity and the second nonmagnetic region 32 vicinity.

The first current and the second current that are necessary for forming the first state and the second state can be lower for the case where the second magnetic layer 22 is greatly curved locally as illustrated in FIG. 5A, FIG. 5B, and FIG. 6A than for the case where the second magnetic layer 22 is curved as an entirety.

FIG. 7A to FIG. 7D are cross-sectional views illustrating portions of other magnetic memory devices according to the first embodiment.

In the magnetic memory devices illustrated in FIG. 7A to FIG. 7D, the first compound layer 40 is provided between a portion of the conductive layer 10 and another portion of the conductive layer 10 in the X-axis direction. For example, the first compound layer 40 does not overlap the base layer 20 in the X-axis direction. Otherwise, the configurations of the magnetic memory devices illustrated in FIG. 7A to FIG. 7D are respectively similar to, for example, the magnetic memory devices illustrated in FIG. 5A, FIG. 5B, FIG. 6A, and FIG. 6B.

FIG. 8A to FIG. 8D are cross-sectional views illustrating portions of other magnetic memory devices according to the first embodiment.

The magnetic memory devices illustrated in FIG. 8A to FIG. 8D include a first layer 45. The direction from the first compound layer 40 toward the first layer 45 is aligned with the X-axis direction. The first layer 45 is multiply provided in the X-axis direction. The multiple first layers 45 are separated from each other. The first compound layer 40 is provided between the first layers 45 in the X-axis direction. The first compound layer 40 includes, for example, a compound of a first element and a second element. The first element and the second element are different from each other. The first layer 45 includes a third element that is different from the first element and the second element. The first layer 45 may include a compound of the third element. The first layer 45 includes, for example, silicon oxide.

The internal stress of the first layer 45 is different from the internal stress of the first compound layer 40. By providing the first layer 45, the stress that acts on the stacked body SB can be adjusted. In the case where at least a portion of the first layer 45 and at least a portion of the stacked body SB do not overlap in the Z-axis direction, it is desirable for the electrical resistivity of the first layer 45 to be smaller than the electrical resistivity of the first compound layer 40. By setting the electrical resistivity of the first layer 45 to be smaller than the electrical resistivity of the first compound layer 40, the first current and the second current for forming the first state and the second state can be small.

Otherwise, the configurations of the magnetic memory devices illustrated in FIG. 8A to FIG. 8D are respectively similar to, for example, the magnetic memory devices illustrated in FIG. 5A, FIG. 5B, FIG. 6A, and FIG. 6B.

Figure 9A:
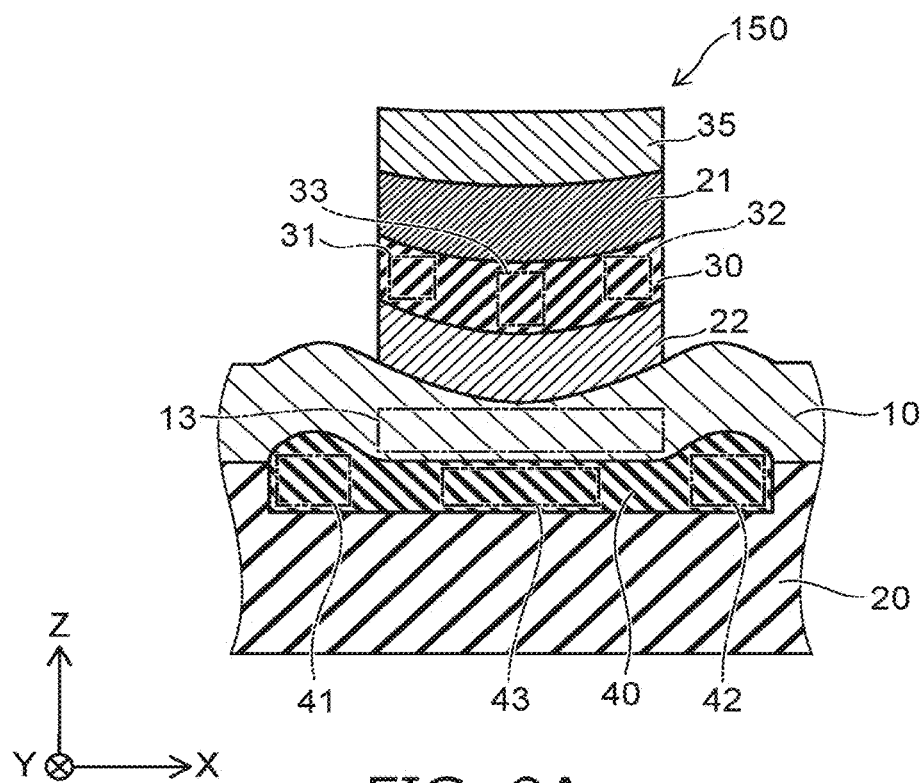
FIG. 9A and FIG. 9B are cross-sectional views illustrating portions of other magnetic memory devices according to the first embodiment.
Figure 9B:
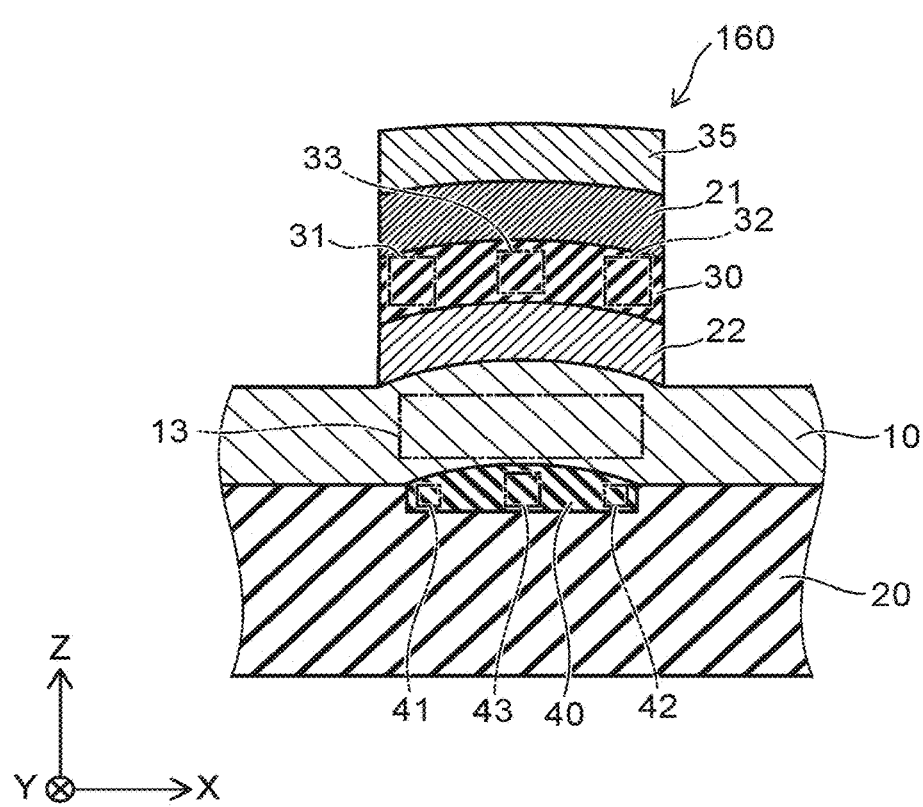

FIG. 9A and FIG. 9B are cross-sectional views illustrating portions of other magnetic memory devices according to the first embodiment.

In a magnetic memory device 150 illustrated in FIG. 9A and a magnetic memory device 160 illustrated in FIG. 9B, the length in the Z-axis direction changes in the X-axis direction for each of the first magnetic layer 21, the second magnetic layer 22, and the first nonmagnetic layer 30.

In the magnetic memory device 150, the length in the Z-axis direction of the third nonmagnetic region 33 is longer than the length in the Z-axis direction of the first nonmagnetic region 31 and longer than the length in the Z-axis direction of the second nonmagnetic region 32. The position in the Z-axis direction of at least a portion of the third nonmagnetic region 33 is between the position in the Z-axis direction of at least a portion of the first nonmagnetic region 31 and the position in the Z-axis direction of the conductive layer 10 and between the position in the Z-axis direction of at least a portion of the second nonmagnetic region 32 and the position in the Z-axis direction of the conductive layer 10.

In the magnetic memory device 160, the length in the Z-axis direction of the third nonmagnetic region 33 is shorter than the length in the Z-axis direction of the first nonmagnetic region 31 and shorter than the length in the Z-axis direction of the second nonmagnetic region 32. The position in the Z-axis direction of at least a portion of the first nonmagnetic region 31 and the position in the Z-axis direction of at least a portion of the second nonmagnetic region 32 are between the position in the Z-axis direction of at least a portion of the third nonmagnetic region 33 and the position in the Z-axis direction of the conductive layer 10. The third nonmagnetic region 33 overlaps at least a portion of the first magnetic layer 21 in the X-axis direction.

The curvatures of the first magnetic layer 21, the second magnetic layer 22, and the first nonmagnetic layer 30 each become gradual from the second magnetic layer 22 toward the electrode 35.

One portion of the second magnetic layer 22 overlaps the third nonmagnetic region 33 in the Z-axis direction; and another portion of the second magnetic layer 22 overlaps the first nonmagnetic region 31 or the second nonmagnetic region 32 in the Z-axis direction. In the magnetic memory device 150, the length in the Z-axis direction of the one portion of the second magnetic layer 22 recited above is longer than the length in the Z-axis direction of the other portion of the second magnetic layer 22 recited above. In the magnetic memory device 160, the length in the Z-axis direction of the one portion of the second magnetic layer 22 recited above is shorter than the length in the Z-axis direction of the other portion of the second magnetic layer 22 recited above.

Figure 10A:
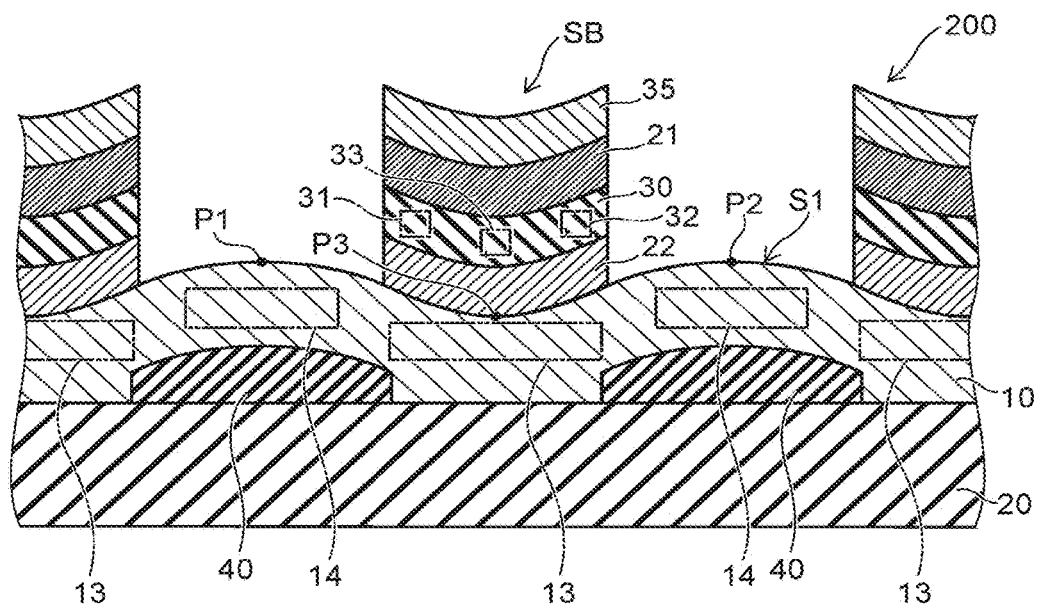
FIG. 10A and FIG. 10B are cross-sectional views illustrating portions of magnetic memory devices according to a second embodiment.
Figure 10B:
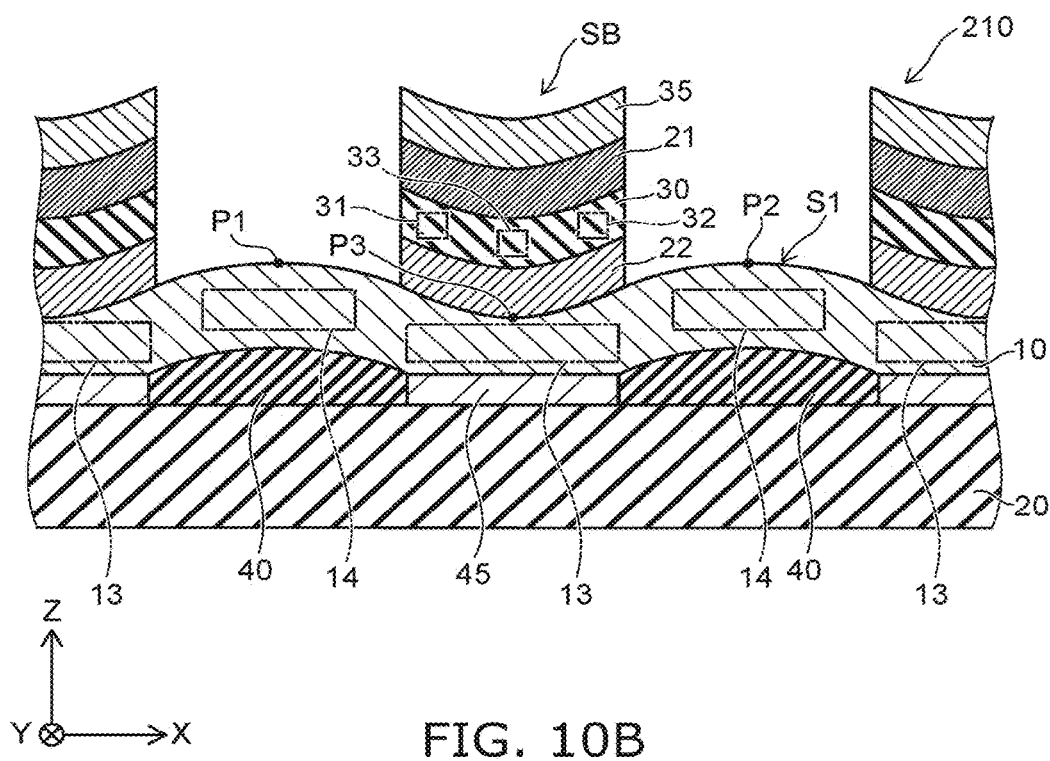

FIG. 10A and FIG. 10B are cross-sectional views illustrating portions of magnetic memory devices according to a second embodiment.

In a magnetic memory device 200 illustrated in FIG. 10A, the conductive layer 10 further includes a fourth portion 14. The fourth portion 14 is multiply provided in the X-axis direction. One of the multiple fourth portions 14 is provided between the first portion 11 and the third portion 13 in the X-axis direction. Another one of the multiple fourth portions 14 is provided between the second portion 12 and the third portion 13 in the X-axis direction. For example, the multiple third portions 13 and the multiple fourth portions 14 are provided alternately in the X-axis direction.

The direction from the first compound layer 40 toward the fourth portion 14 is aligned with the Z-axis direction. A portion of the first compound layer 40 may overlap the third portion 13 in the Z-axis direction. The first surface S1 includes the first point P1, the second point P2, and the third point P3. The direction from one of the multiple first compound layers 40 and one of the multiple fourth portions 14 toward the first point P1 is aligned with the Z-axis direction. The direction from another one of the multiple first compound layers 40 and another one of the multiple fourth portions 14 toward the second point P2 is aligned with the Z-axis direction. The direction from one of the multiple third portions 13 toward the third point P3 is aligned with the Z-axis direction. The first point P1 and the second point P2 do not overlap the second magnetic layer 22 in the Z-axis direction. The third point P3 overlaps the second magnetic layer 22 in the Z-axis direction.

The position in the X-axis direction of the third point P3 is between the position in the X-axis direction of the first point P1 and the position in the X-axis direction of the second point P2. The position in the Z-axis direction of the third point P3 is between the position in the Z-axis direction of the first point P1 and the position in the Z-axis direction of the first compound layer 40 and between the position in the Z-axis direction of the second point P2 and the position in the Z-axis direction of the first compound layer 40.

In the first nonmagnetic layer 30, the position in the Z-axis direction of at least a portion of the third nonmagnetic region 33 is between the position in the Z-axis direction of at least a portion of the first nonmagnetic region 31 and the position in the Z-axis direction of the conductive layer 10. The position in the Z-axis direction of at least a portion of the third nonmagnetic region 33 is between the position in the Z-axis direction of at least a portion of the second nonmagnetic region 32 and the position in the Z-axis direction of the conductive layer 10.

In the magnetic memory device 200 illustrated in FIG. 10A, the first compound layer 40 is provided between a portion of the conductive layer 10 and another portion of the conductive layer 10 in the X-axis direction. Or, the first compound layer 40 may be provided between a portion of the conductive layer 10 and another portion of the conductive layer 10 and between a portion of the base layer 20 and another portion of the base layer 20 in the X-axis direction.

As in a magnetic memory device 210 illustrated in FIG. 10B, the first compound layer 40 may be provided between the multiple first layers 45 in the X-axis direction. The direction from the first layer 45 toward the third portion 13 and the stacked body SB is aligned with the Z-axis direction. The internal stress of the first layer 45 is different from the internal stress of the first compound layer 40.

As in the magnetic memory devices 200 and 210, in the case where the first compound layer 40 overlaps the fourth portion 14 in the Z-axis direction, the curvatures at the two X-axis direction end vicinities can be large for each of the first magnetic layer 21, the second magnetic layer 22, and the first nonmagnetic layer 30; and each of these layers can be curved locally. Accordingly, the first current and the second current for forming the first state and the second state can be small while reducing the error rate in the program operation and the read operation.

As illustrated in FIG. 10B, in the case where the first layer 45 and the stacked body SB overlap in the Z-axis direction, a distribution may occur in the change of the magnetic anisotropy induced by the second magnetic layer 22 when the select voltage is applied to the electrode 35. The orientation of the magnetization at the end portion vicinity of the second magnetic layer 22 is unstable compared to the orientation of the magnetization at the center vicinity of the second magnetic layer 22. The instability of the orientation of the magnetization at the end portion vicinity of the second magnetic layer 22 may be improved by the distribution occurring in the change of the magnetic anisotropy induced by the second magnetic layer 22. Thereby, the error rate in the program operation and the read operation of the magnetic memory device 210 can be reduced further. The operations can be stabilized further.

In the magnetic memory devices 200 and 210, the first compound layer 40 is insulative or conductive. In the case where the first compound layer 40 is conductive, the voltage of the operations of the magnetic memory devices 200 and 210 can be reduced.

Figure 11:
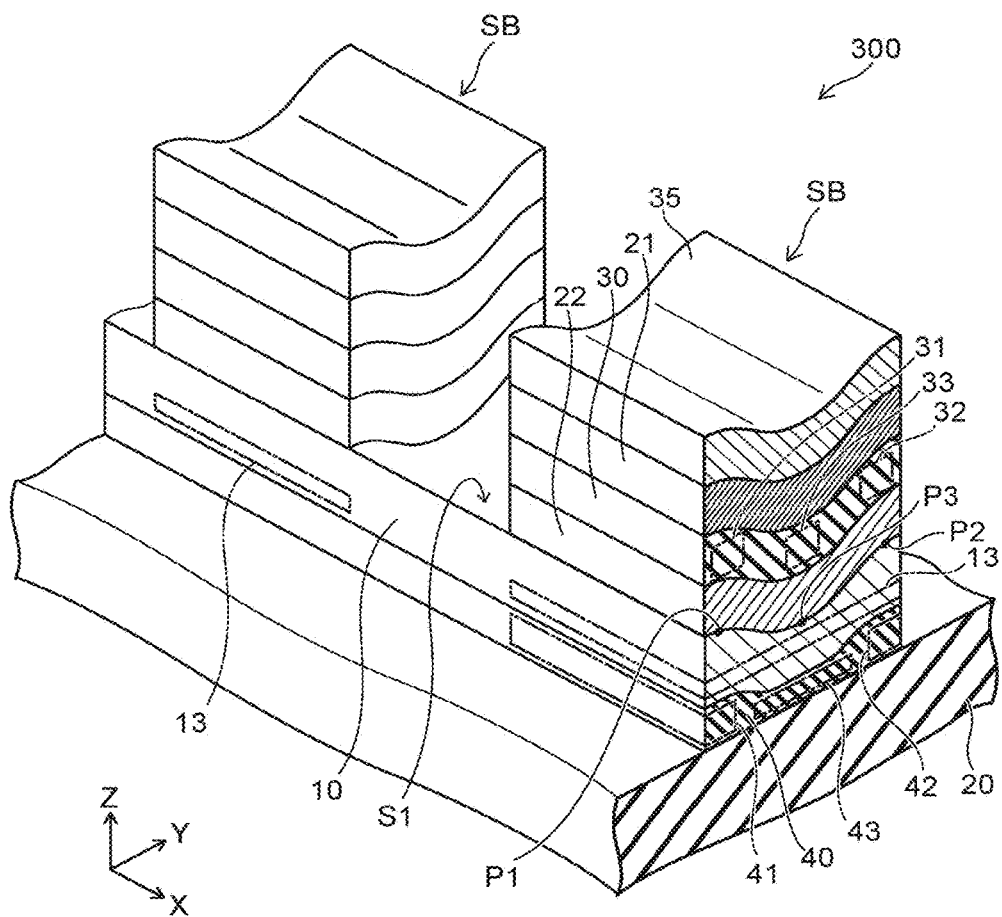
FIG. 11 is a perspective cross-sectional view illustrating a portion of a magnetic memory device according to a third embodiment.

FIG. 11 is a perspective cross-sectional view illustrating a portion of a magnetic memory device according to a third embodiment.

Figure 12:
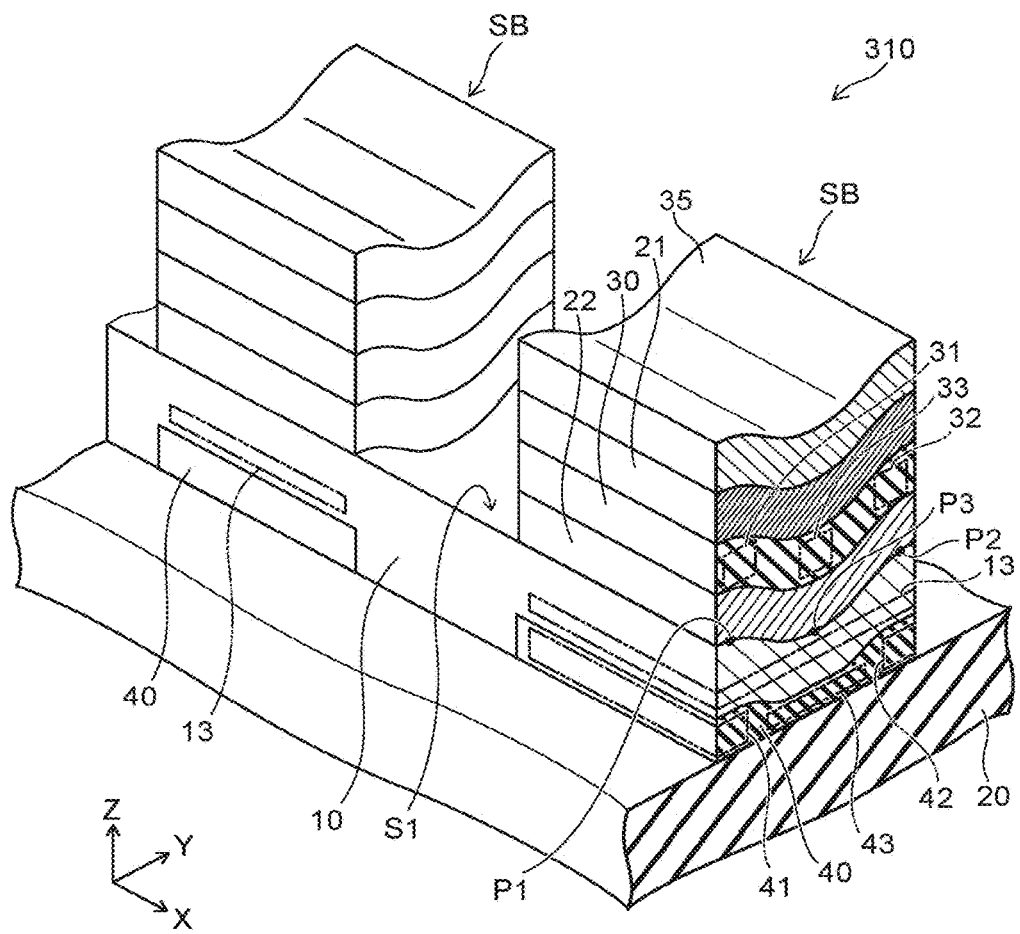
FIG. 12 is a perspective cross-sectional view illustrating a portion of another magnetic memory device according to the third embodiment.

FIG. 12 is a perspective cross-sectional view illustrating a portion of another magnetic memory device according to the third embodiment.

In the magnetic memory devices 300 and 310 illustrated in FIG. 11 and FIG. 12, the thickness of the first compound layer 40 changes in the Y-axis direction. In the first compound layer 40, the third region 43 is provided between the first region 41 and the second region 42 in the Y-axis direction. The length in the Z-axis direction of the third region 43 is, for example, shorter than the length in the Z-axis direction of the first region 41 and shorter than the length in the Z-axis direction of the second region 42.

The position in the Y-axis direction of the third point P3 of the first surface S1 is between the position in the Y-axis direction of the first point P1 and the position in the Y-axis direction of the second point P2. The direction from the first point P1 toward the first region 41, the direction from the second point P2 toward the second region 42, and the direction from the third point P3 toward the third region 43 each are aligned with the Z-axis direction. The position in the Z-axis direction of the third point P3 is, for example, between the position in the Z-axis direction of the first point P1 and the position in the Z-axis direction of the first compound layer 40 and between the position in the Z-axis direction of the second point P2 and the position in the Z-axis direction of the first compound layer 40.

In the first nonmagnetic layer 30, the position in the Y-axis direction of the third nonmagnetic region 33 is between the position in the Y-axis direction of the first nonmagnetic region 31 and the position in the Y-axis direction of the second nonmagnetic region 32. The position in the Z-axis direction of at least a portion of the third nonmagnetic region 33 is, for example, between the position in the Z-axis direction of at least a portion of the first nonmagnetic region 31 and the position in the Z-axis direction of the conductive layer 10. The third nonmagnetic region 33 may overlap at least a portion of the second magnetic layer 22 in the Y-axis direction. The position in the Z-axis direction of at least a portion of the third nonmagnetic region 33 is, for example, between the position in the Z-axis direction of at least a portion of the second nonmagnetic region 32 and the position in the Z-axis direction of the conductive layer 10.

In the magnetic memory device 300 illustrated in FIG. 11, the multiple third portions 13 are provided between the first compound layer 40 and the multiple first nonmagnetic layers 30 in the Z-axis direction. Multiple first compound layers 40 may be provided as in the magnetic memory device 310 illustrated in FIG. 12. In such a case, the multiple third portions 13 are provided respectively between the multiple first nonmagnetic layers 30 and the multiple first compound layers 40 in the Z-axis direction.

FIG. 13A to FIG. 13D and FIG. 14A to FIG. 14C are cross-sectional views illustrating portions of other magnetic memory devices according to the third embodiment.

Figure 13A:
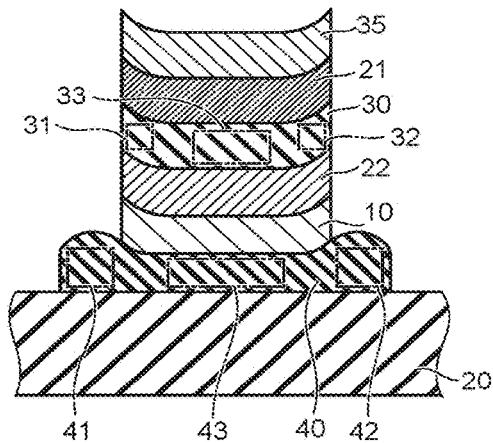
FIG. 13A to FIG. 13D and FIG. 14A to FIG. 14C are cross-sectional views illustrating portions of other magnetic memory devices according to the third embodiment.
Figure 13B:
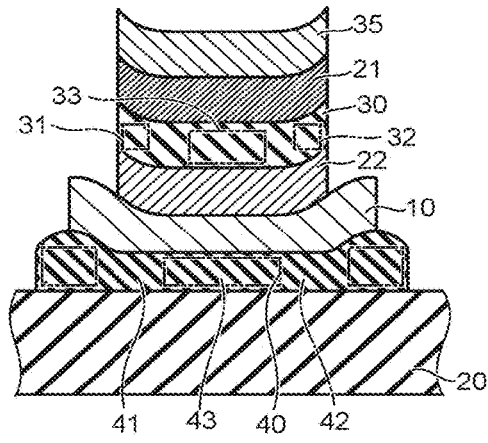

As illustrated in FIG. 13A and FIG. 13B, the length in the Y-axis direction of the first compound layer 40 may be longer than the length in the Y-axis direction of the conductive layer 10. As illustrated in FIG. 13A, the length in the Y-axis direction of the conductive layer 10 is, for example, the same as the length in the Y-axis direction of the second magnetic layer 22. Or, as illustrated in FIG. 13B, the length in the Y-axis direction of the conductive layer 10 may be longer than the length in the Y-axis direction of the second magnetic layer 22. As illustrated in FIG. 13A and FIG. 13B, the curvature of the third nonmagnetic region 33 is, for example, larger than the curvature of the first nonmagnetic region 31 and larger than the curvature of the second nonmagnetic region 32.

Figure 13C:
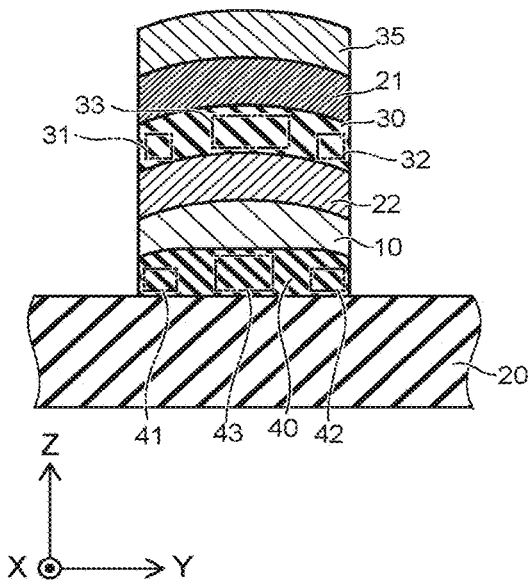
Figure 13D:
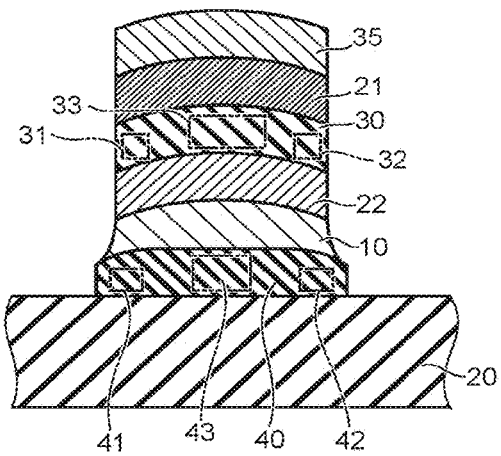

As illustrated in FIG. 13C and FIG. 13D, the position in the Z-axis direction of the first nonmagnetic region 31 and the position in the Z-axis direction of the second nonmagnetic region 32 may be between the position in the Z-axis direction of the third nonmagnetic region 33 and the position in the Z-axis direction of the conductive layer 10. The length in the Z-axis direction of the third region 43 is longer than the length in the Z-axis direction of the first region 41 and longer than the length in the Z-axis direction of the second region 42.

Figure 14A:
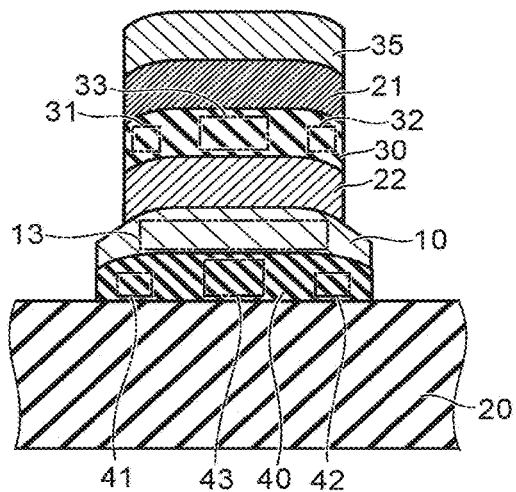
Figure 14B:
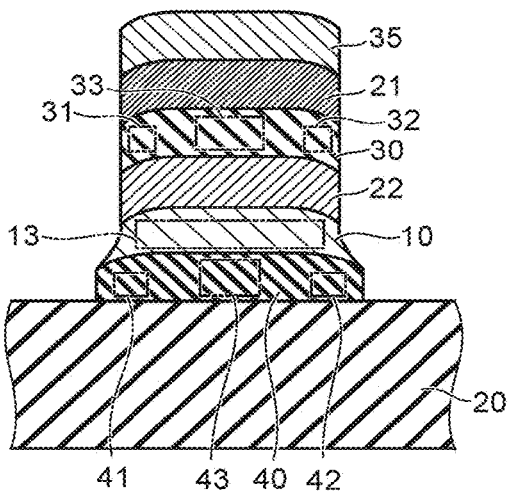

As illustrated in FIG. 13C and FIG. 14A, the length in the Y-axis direction of the first compound layer 40 is, for example, the same as the length in the Y-axis direction of the conductive layer 10. As illustrated in FIG. 13D and FIG. 14B, the length in the Y-axis direction of the first compound layer 40 may be longer than the length in the Y-axis direction of at least a portion of the conductive layer 10 and longer than the length in the Y-axis direction of the second magnetic layer 22. As illustrated in FIG. 13D and FIG. 14B, the length in the Y-axis direction of the conductive layer 10 may change in the Z-axis direction.

Figure 14C:
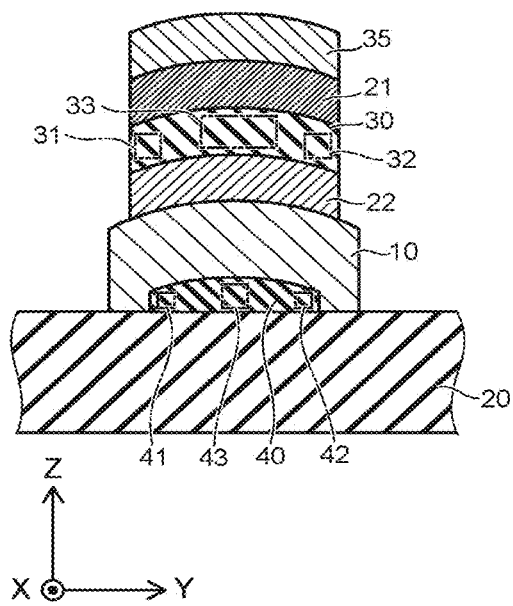

As illustrated in FIG. 13C, FIG. 13D, and FIG. 14C, the curvature of the first nonmagnetic region 31 is, for example, substantially the same as the curvature of the second nonmagnetic region 32 and substantially the same as the curvature of the third nonmagnetic region 33. As illustrated in FIG. 14A and FIG. 14B, the curvature of the second nonmagnetic region 32 may be larger than the curvature of the third nonmagnetic region 33; and the curvature of the first nonmagnetic region 31 may be larger than the curvature of the third nonmagnetic region 33.

As illustrated in FIG. 14C, the length in the Y-axis direction of the first compound layer 40 may be shorter than the length in the Y-axis direction of the conductive layer 10 and shorter than the length in the Y-axis direction of the second magnetic layer 22. In such a case, for example, the first compound layer 40 is provided between a portion of the conductive layer 10 and another portion of the conductive layer 10 in the Y-axis direction.

In the magnetic memory devices illustrated in FIG. 13A to FIG. 13D and FIG. 14A to FIG. 14C, the first compound layer 40 extends in the X-axis direction similarly to the magnetic memory device 300 illustrated in FIG. 11. Or, in the magnetic memory devices illustrated in FIG. 13A to FIG. 13D and FIG. 14A to FIG. 14C, the first compound layer 40 may be multiply provided in the X-axis direction similarly to the magnetic memory device 310 illustrated in FIG. 12.

In the magnetic memory devices illustrated in FIG. 11, FIG. 12, FIG. 13A to FIG. 13D, and FIG. 14A to FIG. 14C, the length in the Z-axis direction changes in the Y-axis direction for each of the first magnetic layer 21, the second magnetic layer 22, and the first nonmagnetic layer 30 as in the magnetic memory devices illustrated in FIG. 9A and FIG. 9B.

For example, in the magnetic memory devices illustrated in FIG. 11, FIG. 12, FIG. 13A, and FIG. 13B, the length in the Z-axis direction of the third nonmagnetic region 33 may be longer than the length in the Z-axis direction of the first nonmagnetic region 31 and longer than the length in the Z-axis direction of the second nonmagnetic region 32.

For example, in the magnetic memory devices illustrated in FIG. 13C, FIG. 13D, and FIG. 14A to FIG. 14C, the length in the Z-axis direction of the third nonmagnetic region 33 may be shorter than the length in the Z-axis direction of the first nonmagnetic region 31 and shorter than the length in the Z-axis direction of the second nonmagnetic region 32.

The thickness of the first compound layer 40 may change in the X-axis direction and the Y-axis direction. In such a case, the positions in the Z-axis direction of each point of the first nonmagnetic layer 30 change in the X-axis direction and the Y-axis direction. For example, the first magnetic layer 21 and the second magnetic layer 22 are curved along the first nonmagnetic layer 30. In such a case, the magnetic in-plane anisotropies of the first magnetic layer 21 and the second magnetic layer 22 change along the direction having the larger curvature.

Figure 15:
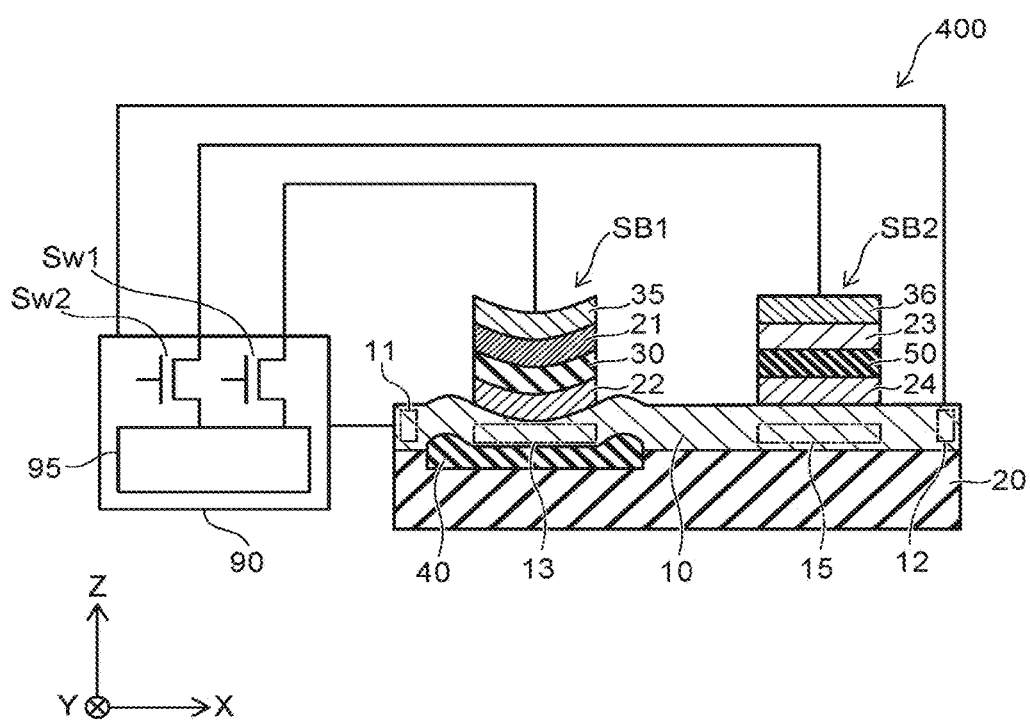
FIG. 15 is a cross-sectional view illustrating a magnetic memory device according to a fourth embodiment.

FIG. 15 is a cross-sectional view illustrating a magnetic memory device according to a fourth embodiment.

In the magnetic memory device 400 illustrated in FIG. 15, the conductive layer 10 further includes a fifth portion 15. The fifth portion 15 is provided between the third portion 13 and the second portion 12 in the X-axis direction. The fifth portion 15 is separated from the third portion 13 in the X-axis direction. A third magnetic layer 23 is separated from the fifth portion 15 in the Z-axis direction. A fourth magnetic layer 24 is provided between the fifth portion 15 and the third magnetic layer 23. A second nonmagnetic layer 50 is provided between the third magnetic layer 23 and the fourth magnetic layer 24. The fifth portion 15 overlaps a second stacked body SB2 including the third magnetic layer 23, the fourth magnetic layer 24, the second nonmagnetic layer 50, and an electrode 36 in the Z-axis direction.

The first nonmagnetic layer 30 is curved. The third magnetic layer 23, the fourth magnetic layer 24, and the second nonmagnetic layer 50 are not curved. The second nonmagnetic layer 50 is provided along the X-axis direction and the Y-axis direction.

The electrical resistance value of a first stacked body SB1 is different from the electrical resistance value of the second stacked body SB2 even in the case where the orientations of the magnetizations of the first magnetic layer 21 and the second magnetic layer 22 are the same and the orientations of the magnetizations of the third magnetic layer 23 and the fourth magnetic layer 24 are the same. Specifically, the electrical resistance value of a path including the first magnetic layer 21, the first nonmagnetic layer 30, and the second magnetic layer 22 is different from the electrical resistance value of a path including the third magnetic layer 23, the second nonmagnetic layer 50, and the fourth magnetic layer 24. For example, this is based on the second magnetic layer 22 being curved but the fourth magnetic layer 24 not being curved.

For example, the electrical resistance value of the first nonmagnetic layer 30 is different from the electrical resistance value of the second nonmagnetic layer 50. For example, the product (RA) of the resistance and the surface area of the first nonmagnetic layer 30 is different from the product of the resistance and the surface area of the second nonmagnetic layer 50. For example, this is based on the first nonmagnetic layer 30 being curved but the second nonmagnetic layer 50 not being curved.

The electrical resistance value between the electrode 35 and the electrode 36 changes according to the relative relationship between the orientation of the magnetization of the first magnetic layer 21 and the orientation of the magnetization of the second magnetic layer 22 and the relative relationship between the orientation of the magnetization of the third magnetic layer 23 and the orientation of the magnetization of the fourth magnetic layer 24. It is possible to change the electrical resistance value between the electrode 35 and the electrode 36 between multiple states due to the relative relationships of the orientations of the magnetizations of these magnetic layers, the electrical resistance value between the first nonmagnetic layer 30 and the second nonmagnetic layer 50, and the difference of the RAs. In other words, multi-bit recording is possible in the magnetic memory device 400 according to the embodiment.

Figure 16A:
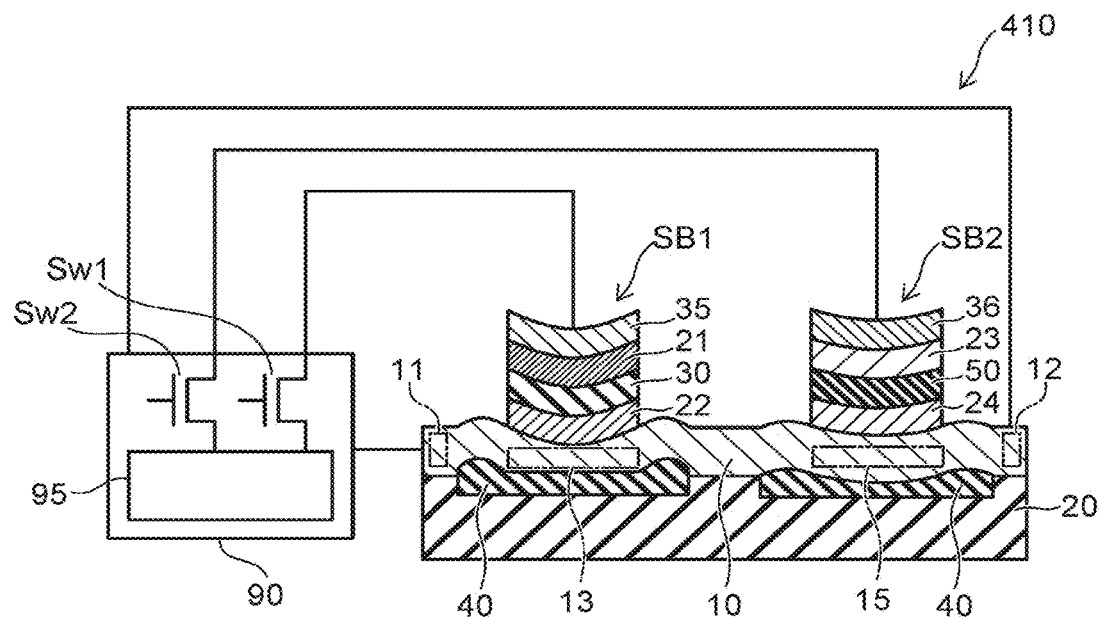
FIG. 16A and FIG. 16B are cross-sectional views illustrating another magnetic memory device according to the fourth embodiment.
Figure 16B:
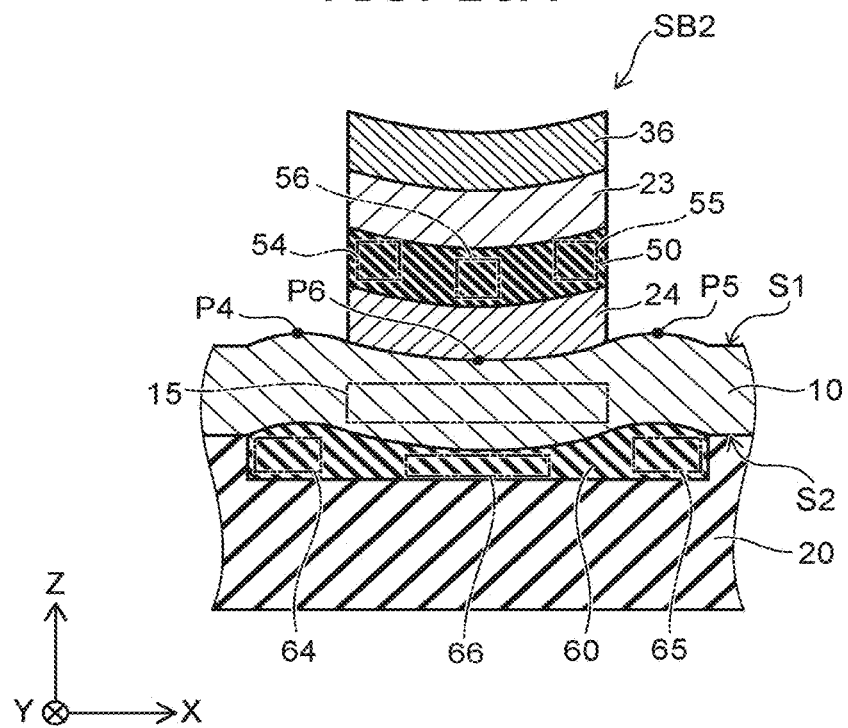

FIG. 16A and FIG. 16B are cross-sectional views illustrating another magnetic memory device according to the fourth embodiment.

FIG. 16B is a cross-sectional view in which a portion of FIG. 16A is enlarged.

The magnetic memory device 410 illustrated in FIG. 16A further includes a second compound layer 60. One of the multiple third portions 13 overlaps the first compound layer 40 in the Z-axis direction. Another one of the multiple third portions 13 overlaps the second compound layer 60 in the Z-axis direction.

The length in the Z-axis direction of the second compound layer 60 changes in the X-axis direction. The second compound layer 60 includes a fourth region 64, a fifth region 65, and a sixth region 66. The sixth region 66 is provided between the fourth region 64 and the fifth region 65 in the X-axis direction. The length in the Z-axis direction of the sixth region 66 is, for example, shorter than the length in the Z-axis direction of the fourth region 64 and shorter than the length in the Z-axis direction of the fifth region 65.

The length in the X-axis direction of the second compound layer 60 is, for example, longer than the length in the X-axis direction of the second nonmagnetic layer 50. The length in the X-axis direction of the second compound layer 60 may be the same as the length in the X-axis direction of the second nonmagnetic layer 50. The length in the X-axis direction of the second compound layer 60 may be shorter than the length in the X-axis direction of the second nonmagnetic layer 50.

The first surface S1 further includes a fourth point P4, a fifth point P5, and a sixth point P6. The position in the X-axis direction of the sixth point P6 is between the position in the X-axis direction of the fourth point P4 and the position in the X-axis direction of the fifth point P5. The direction from the fourth region 64 toward the fourth point P4, the direction from the fifth region 65 toward the fifth point P5, and the direction from the sixth region 66 toward the sixth point P6 each are aligned with the Z-axis direction.

The position in the Z-axis direction of the sixth point P6 is, for example, between the position in the Z-axis direction of the fourth point P4 and the position in the Z-axis direction of the second compound layer 60 and between the position in the Z-axis direction of the fifth point P5 and the position in the Z-axis direction of the second compound layer 60.

The second nonmagnetic layer 50 includes a fourth nonmagnetic region 54, a fifth nonmagnetic region 55, and a sixth nonmagnetic region 56. The position in the X-axis direction of the sixth nonmagnetic region 56 is between the position in the X-axis direction of the fourth nonmagnetic region 54 and the position in the X-axis direction of the fifth nonmagnetic region 55.

The position in the Z-axis direction of at least a portion of the sixth nonmagnetic region 56 is different from the position in the Z-axis direction of at least a portion of the fourth nonmagnetic region 54 and the position in the Z-axis direction of at least a portion of the fifth nonmagnetic region 55. The position in the Z-axis direction of the sixth nonmagnetic region 56 is, for example, between the position in the Z-axis direction of the fourth nonmagnetic region 54 and the position in the Z-axis direction of the conductive layer 10 and between the position in the Z-axis direction of the fifth nonmagnetic region 55 and the position in the Z-axis direction of the conductive layer 10.

The first nonmagnetic layer 30 of the first stacked body SB1 is curved. The second nonmagnetic layer 50 of the second stacked body SB2 is curved. The shape of the first nonmagnetic layer 30 is different from the shape of the second nonmagnetic layer 50. Similarly, the shapes of the first magnetic layer 21 and the second magnetic layer 22 are different from the shapes of the third magnetic layer 23 and the fourth magnetic layer 24. For example, the difference of these shapes is based on the following difference.

The difference of the length in the Z-axis direction between the fourth region 64 and the sixth region 66 is different from the difference of the length in the Z-axis direction between the first region 41 and the third region 43. Therefore, the shape of the second compound layer 60 is different from the shape of the first compound layer 40. The distance in the Z-axis direction between the first point P1 and the third point P3 is different from the distance in the Z-axis direction between the fourth point P4 and the sixth point P6.

The compound that is included in the second compound layer 60 is, for example, the same as the compound included in the first compound layer 40. The compound that is included in the second compound layer 60 may be different from the compound included in the first compound layer 40.

The electrical resistance value of the first stacked body SB1 is different from the electrical resistance value of the second stacked body SB2 even in the case where the orientations of the magnetizations of the first magnetic layer 21 and the second magnetic layer 22 are the same and the orientations of the magnetizations of the third magnetic layer 23 and the fourth magnetic layer 24 are the same. For example, this is based on the shapes of the first magnetic layer 21 and the third magnetic layer 23 being different and the shapes of the second magnetic layer 22 and the fourth magnetic layer 24 being different.

For example, the electrical resistance value of the first nonmagnetic layer 30 is different from the electrical resistance value of the second nonmagnetic layer 50. For example, the product (RA) of the resistance and the surface area of the first nonmagnetic layer 30 is different from the product of the resistance and the surface area of the second nonmagnetic layer 50. This is based on the shapes of the first nonmagnetic layer 30 and the second nonmagnetic layer 50 being different.

Similarly to the magnetic memory device 400, multi-bit recording is possible in the magnetic memory device 410 according to the modification.

Figure 17A:
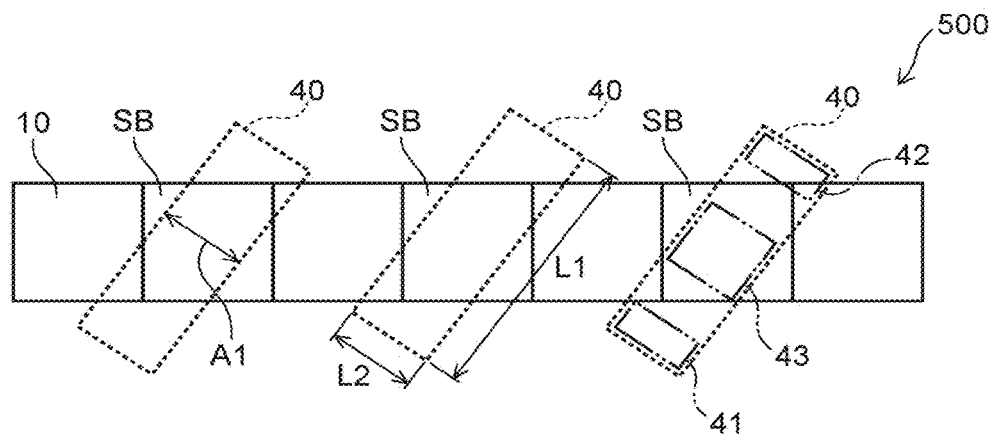
FIG. 17A and FIG. 17B are plan views illustrating portions of magnetic memory devices according to a fifth embodiment.
Figure 17B:
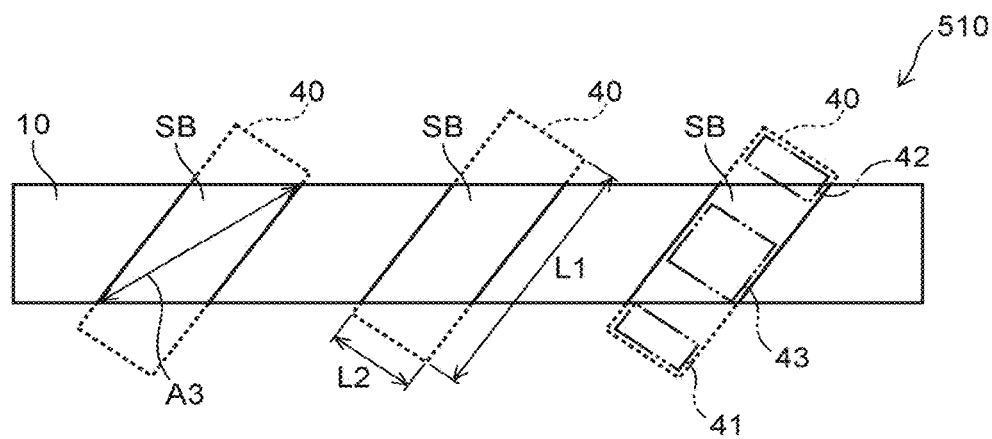
Figure 17B:
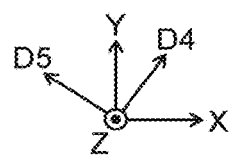

FIG. 17A and FIG. 17B are plan views illustrating portions of magnetic memory devices according to a fifth embodiment.

In FIG. 17A and FIG. 17B, the first compound layer 40 is illustrated by a broken line.

In the magnetic memory devices 500 and 510 illustrated in FIG. 17A and FIG. 17B, the first compound layer 40 is provided along a fourth direction D4. For example, the fourth direction D4 is perpendicular to the Z-axis direction and crosses the X-axis direction and the Y-axis direction.

A portion (the third portion 13) of the conductive layer 10 is provided between the stacked body SB and a portion of the first compound layer 40 in the Z-axis direction. A portion of the first compound layer 40 is provided between a portion of the base layer 20 and a portion (the third portion 13) of the conductive layer 10 in the Z-axis direction.

In the first compound layer 40, the position in the fourth direction D4 of the third region 43 is between the position in the fourth direction D4 of the first region 41 and the position in the fourth direction D4 of the second region 42. The first region 41 and the second region 42 do not overlap the conductive layer 10 and the stacked body SB in the Z-axis direction.

A length L1 of the first compound layer 40 in the fourth direction D4 is longer than a length L2 of the first compound layer 40 in a fifth direction D5. For example, the fifth direction D5 is perpendicular to the Z-axis direction and the fourth direction D4 and crosses the X-axis direction and the Y-axis direction. For example, the orientations of the magnetizations of the first magnetic layer 21 and the second magnetic layer 22 cross the X-axis direction and the Y-axis direction.

When forming the first compound layer 40, for example, the first compound layer 40 expands along the fourth direction D4. The thickness in the Z-axis direction of the first compound layer 40 changes in the fourth direction D4. As a result, the first magnetic layer 21, the second magnetic layer 22, and the first nonmagnetic layer 30 are curved. At this time, for example, the orientations of the magnetizations of the first magnetic layer 21 and the second magnetic layer 22 are aligned with the fifth direction D5 as in arrow A1 illustrated in FIG. 17A. The length in the fourth direction D4 or the fifth direction D5 of the stacked body SB is longer than the length in the X-axis direction or the Y-axis direction of the stacked body SB. Therefore, the orientations of the magnetizations of the first magnetic layer 21 and the second magnetic layer 22 are easily oriented in the fourth direction D4 or the fifth direction D5.

According to the magnetic memory device 500 illustrated in FIG. 17A, the direction of the easy magnetization axis due to the curves of the first magnetic layer 21 and the second magnetic layer 22 and the direction of the easy magnetization axis due to the shape magnetic anisotropies of the first magnetic layer 21 and the second magnetic layer 22 can be aligned. As a result, the yield can be increased.

As in the magnetic memory device 510 illustrated in FIG. 17B, the stacked body SB may be provided along the first compound layer 40. In the example, due to the shape magnetic anisotropy, the orientations of the magnetizations of the first magnetic layer 21 and the second magnetic layer 22 are easily oriented in the direction connecting one end and another end of the stacked body SB in the fourth direction D4 as illustrated by arrow A3 of FIG. 17B. On the other hand, due to the curves of the first magnetic layer 21 and the second magnetic layer 22, the orientations of the magnetizations of the first magnetic layer 21 and the second magnetic layer 22 are changed easily to a direction along the fifth direction D5.

According to the magnetic memory device 510 illustrated in FIG. 17B, the direction of the easy magnetization axis due to the curves of the first magnetic layer 21 and the second magnetic layer 22 and the direction of the easy magnetization axis due to the shape magnetic anisotropies of the first magnetic layer 21 and the second magnetic layer 22 can be different.

In the magnetic memory devices 500 and 510 illustrated in FIG. 17A and FIG. 17B, the orientations of the magnetizations of the first magnetic layer 21 and the second magnetic layer 22 are tilted with respect to the direction (the X-axis direction) in which the current flows through the conductive layer 10. Thereby, the change time of the orientation of the magnetization of the second magnetic layer 22 can be shortened when the current is caused to flow between the first portion 11 and the second portion 12 of the conductive layer 10. According to the embodiment, the information can be programmed to the second magnetic layer 22 in a shorter amount of time.

Figure 18:
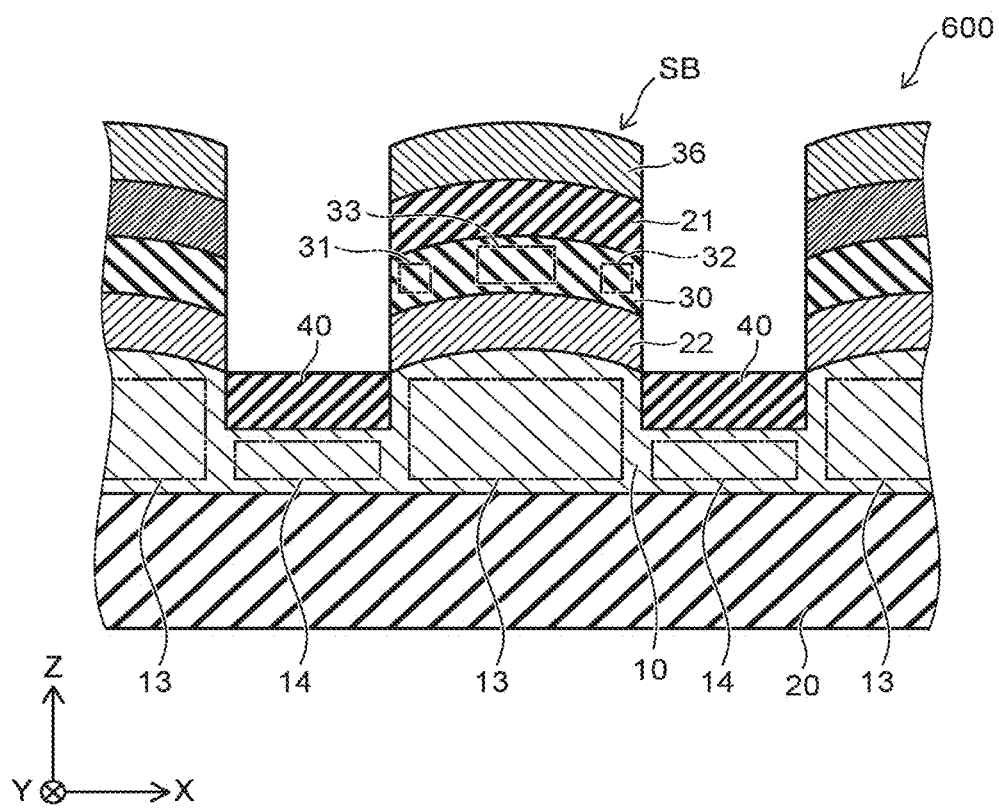
FIG. 18 is a cross-sectional view illustrating a portion of a magnetic memory device according to a sixth embodiment.

FIG. 18 is a cross-sectional view illustrating a portion of a magnetic memory device according to a sixth embodiment.

In the magnetic memory device 600 illustrated in FIG. 18, the fourth portion 14 is provided between the base layer 20 and the first compound layer 40 in the Z-axis direction. The position in the Z-axis direction of the first compound layer 40 is between the position in the Z-axis direction of the fourth portion 14 and the position in the Z-axis direction of the second magnetic layer 22. For example, the first compound layer 40 does not overlap the stacked body SB in the Z-axis direction.

When forming the first compound layer 40, for example, a portion of the third portion 13 is subjected to compressive stress. The first magnetic layer 21, the second magnetic layer 22, and the first nonmagnetic layer 30 are curved by the compressive stress.

Figure 19:
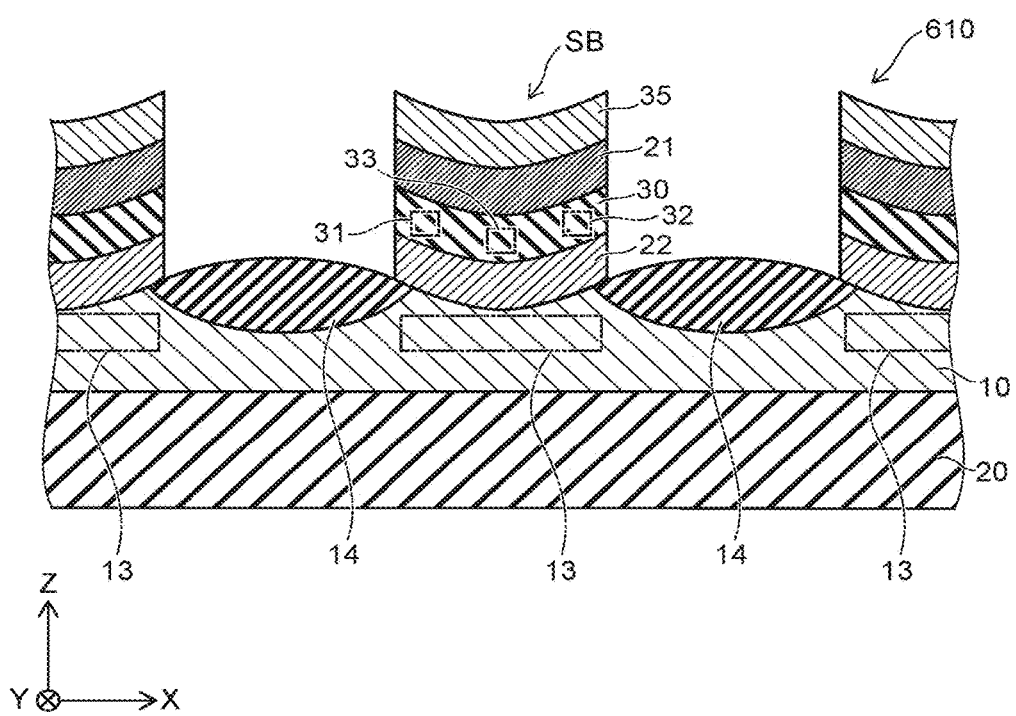
FIG. 19 is a cross-sectional view illustrating a portion of another magnetic memory device according to the sixth embodiment.

FIG. 19 is a cross-sectional view illustrating a portion of another magnetic memory device according to the sixth embodiment.

In the magnetic memory device 610 illustrated in FIG. 19, the length in the Z-axis direction of the first compound layer 40 changes in the X-axis direction. For example, a portion of the first compound layer 40 does not overlap the stacked body SB in the Z-axis direction; and another portion of the first compound layer 40 overlaps the stacked body SB in the Z-axis direction. The length in the Z-axis direction of the portion of the first compound layer 40 recited above is longer than the length in the Z-axis direction of the other portion of the first compound layer 40 recited above.

When forming the first compound layer 40, for example, the first compound layer 40 expands in the X-axis direction. Due to the expansion of the first compound layer 40, a portion of the first compound layer 40 spreads under the end portion in the X-axis direction of the stacked body SB. As a result, the first magnetic layer 21, the second magnetic layer 22, and the first nonmagnetic layer 30 are curved.

Figure 20A:
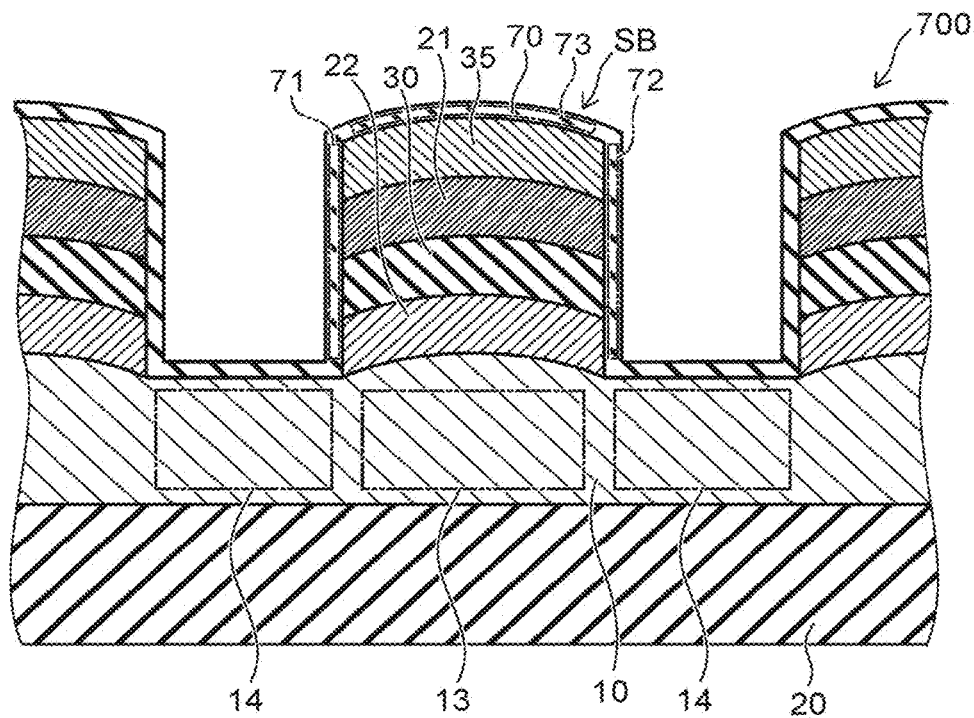
FIG. 20A and FIG. 20B are cross-sectional views illustrating portions of magnetic memory devices according to a seventh embodiment.
Figure 20B:
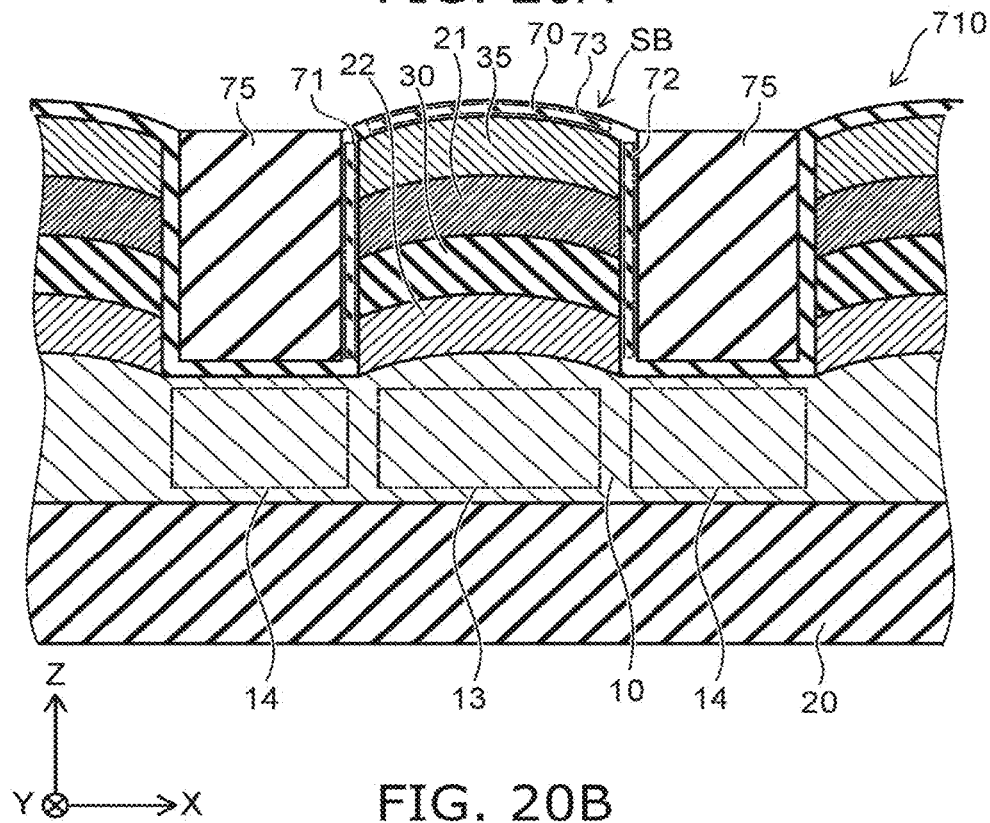

FIG. 20A and FIG. 20B are cross-sectional views illustrating portions of magnetic memory devices according to a seventh embodiment.

The magnetic memory device 700 illustrated in FIG. 20A further includes a first insulating layer 70. The first insulating layer 70 includes a first insulating region 71, a second insulating region 72, and a third insulating region 73. The first insulating region 71 and the second insulating region 72 are separated from each other in the X-axis direction. The position in the X-axis direction of the third insulating region 73 is between the position in the X-axis direction of the first insulating region 71 and the position in the X-axis direction of the second insulating region 72. The lengths of the first insulating region 71 and the second insulating region 72 are longer in the Z-axis direction than in the X-axis direction.

The length in the X-axis direction of the third insulating region 73 is longer than the length in the Z-axis direction of the third insulating region 73.

The stacked body SB is provided between the first insulating region 71 and the second insulating region 72 in the X-axis direction. The stacked body SB is provided between the third portion 13 and the third insulating region 73 in the Z-axis direction.

The first insulating layer 70 is formed by, for example, the following processes.

The stacked bodies SB are formed on the conductive layer 10. A metal layer that covers the upper surface of the conductive layer 10 and the surfaces of the stacked bodies SB is formed. The metal layer includes, for example, at least one selected from the group consisting of aluminum, magnesium-boron, boron, calcium, silicon, germanium, gallium, indium, tungsten, titanium, copper, and palladium. When the metal layer is oxidized, the first insulating layer 70 is formed while increasing the volume. When the volume increases, the first magnetic layer 21, the second magnetic layer 22, and the first nonmagnetic layer 30 are curved by the stacked body SB being subjected to compressive stress.

The magnetic memory device 700 illustrated in FIG. 20B further includes a second insulating layer 75. The second insulating layer 75 is provided between the stacked bodies SB. The direction from the fourth portion 14 toward the second insulating layer 75 is aligned with the Z-axis direction. The second insulating layer 75 is multiply provided in the X-axis direction. The first insulating region 71 is provided between one of the multiple second insulating layers 75 and one of the multiple stacked bodies SB in the X-axis direction. The second insulating region 72 is provided between another one of the multiple second insulating layers 75 and the one of the multiple stacked bodies SB in the X-axis direction.

The second insulating layer 75 is formed by, for example, the following processes.

The stacked bodies SB are formed on the conductive layer 10. The first insulating layer 70 that covers the upper surface of the conductive layer 10 and the surfaces of the stacked bodies SB is formed. The first insulating layer 70 includes, for example, aluminum oxide. A metal layer is formed on the first insulating layer 70. The metal layer is formed between the stacked bodies SB in the X-axis direction. The metal layer includes, for example, at least one selected from the group consisting of aluminum, magnesium-boron, boron, calcium, silicon, germanium, gallium, indium, tungsten, titanium, copper, and palladium. When the metal layer is oxidized, the second insulating layer 75 is formed while increasing the volume. When increasing the volume, the first magnetic layer 21, the second magnetic layer 22, and the first nonmagnetic layer 30 are curved by the stacked body SB being subjected to compressive stress.

Figure 21:
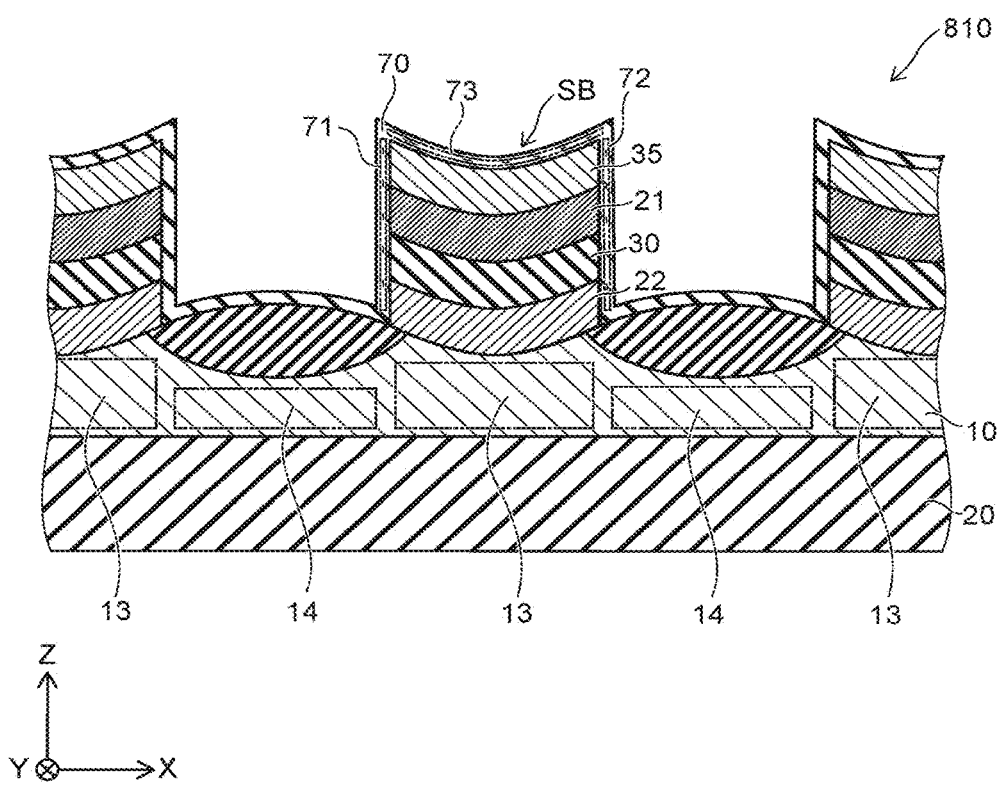
FIG. 21 is a perspective cross-sectional view illustrating a portion of a magnetic memory device according to an eighth embodiment.

FIG. 21 is a perspective cross-sectional view illustrating a portion of a magnetic memory device according to an eighth embodiment.

As in the magnetic memory device 800 illustrated in FIG. 21, at least a portion of the first compound layer 40 may be provided between the fourth portion 14 and the first insulating layer 70 in the Z-axis direction. For example, a portion of the first compound layer 40 overlaps the fourth portion 14 in the Z-axis direction; and another portion of the first compound layer 40 overlaps the stacked body SB in the Z-axis direction. The length in the Z-axis direction of the portion of the first compound layer 40 recited above is longer than the length in the Z-axis direction of the other portion of the first compound layer 40 recited above. For example, a portion of the stacked body SB is provided between a portion of the first compound layer 40 and a portion of the third insulating region 73 in the Z-axis direction.

The first compound layer 40 of the magnetic memory device 800 is formed by, for example, the following processes.

The first insulating layer 70 that covers the upper surface of the conductive layer 10 and the surfaces of the stacked bodies SB is formed. This insulating layer includes, for example, silicon nitride or silicon oxide. An oxygen ion beam or oxygen plasma that has directivity toward the upper surface of the conductive layer 10 is irradiated. A portion of the fourth portion 14 of the conductive layer 10 reacts with the oxygen; and the first compound layer 40 is formed. At this time, the first compound layer 40 expands in the X-axis direction; and a portion of the first compound layer 40 is provided under the end portion in the X-axis direction of the stacked body SB. As a result, the first magnetic layer 21, the second magnetic layer 22, and the first nonmagnetic layer 30 are curved.

Figure 22:
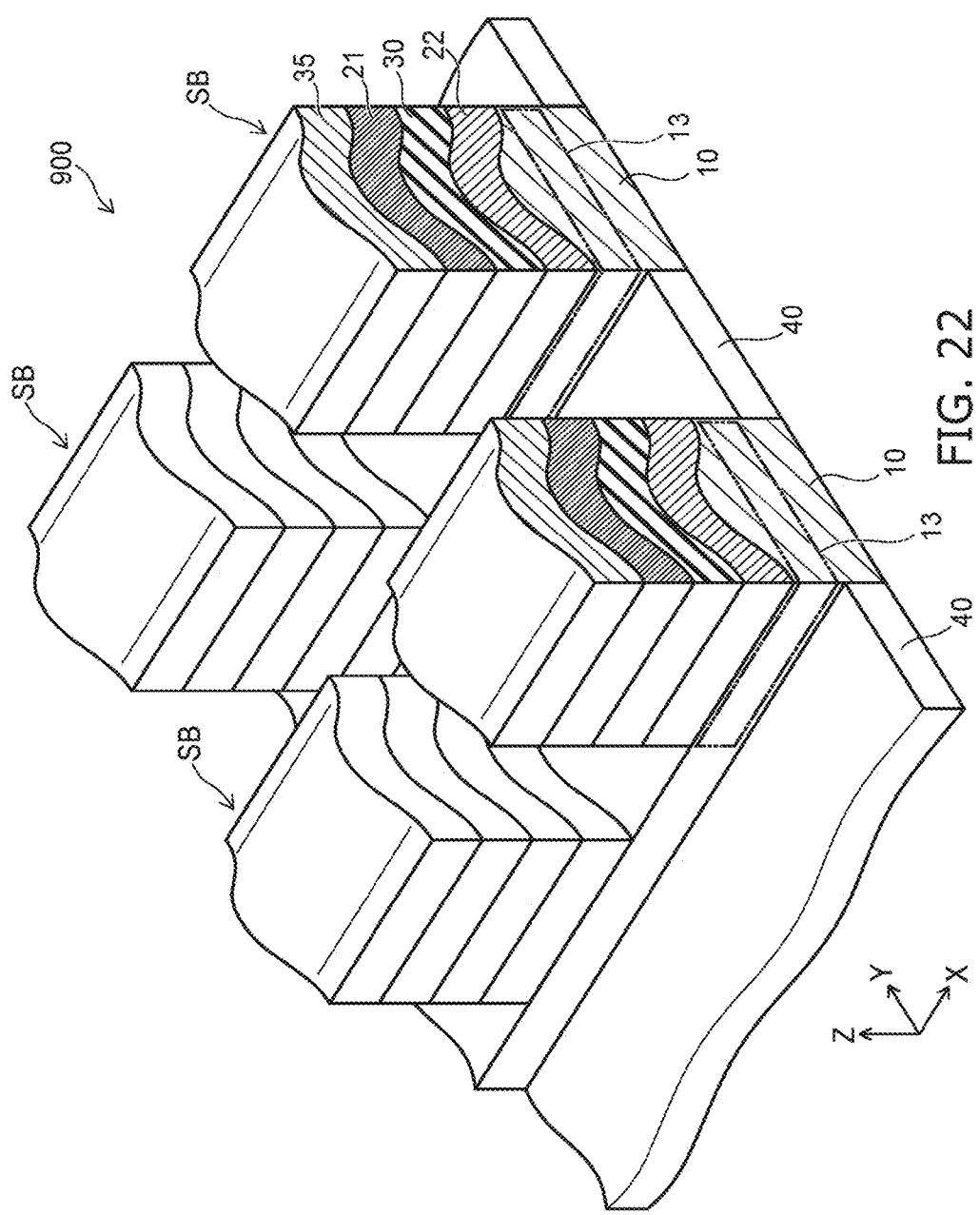
FIG. 22 is a perspective cross-sectional view illustrating a portion of a magnetic memory device according to a ninth embodiment.

FIG. 22 is a perspective cross-sectional view illustrating a portion of a magnetic memory device according to a ninth embodiment.

In the magnetic memory device 900 illustrated in FIG. 22, the first compound layer 40 is provided between at least a portion of one conductive layer 10 and at least a portion of another conductive layer 10 in the Y-axis direction. One first compound layer 40 extends in the X-axis direction between the one conductive layer 10 and the other conductive layer 10. Or, the first compound layer 40 may be multiply provided in the X-axis direction between the one conductive layer 10 and the other conductive layer 10. In such a case, the position in the X-axis direction of one of the multiple first compound layers 40 is the same as the position in the X-axis direction of one of the multiple stacked bodies SB.

It is desirable for the first compound layer 40 to be insulative so that a current does not flow between the conductive layers 10. When the first compound layer 40 is formed between the conductive layers 10, the conductive layer 10 is subjected to compressive stress by the expansion of the volume of the first compound layer 40. The first magnetic layer 21, the second magnetic layer 22, and the first nonmagnetic layer 30 are curved by the compressive stress. As a result, for example, the position in the Z-axis direction of at least a portion of the first nonmagnetic region 31 and the position in the Z-axis direction of at least a portion of the second nonmagnetic region 32 are provided between the position in the Z-axis direction of at least a portion of the third nonmagnetic region 33 and the position in the Z-axis direction of the conductive layer 10.

The second insulating layer 75 is formed by, for example, the following processes.

The magnetic film 22A, the nonmagnetic film 30A, the magnetic film 21A, and the metal film 35A are formed on the conductive film 10A. This structure body is divided into a plurality in the Y-direction. At this time, a portion of the conductive film 10A remains. The stacked body SB is curved by causing a portion of the remaining conductive film 10A to expand by oxidizing the portion of the remaining conductive film 10A.

Or, the stacked body SB may be curved by forming a film that excessively includes oxygen under a portion of the conductive film 10A and by causing the expansion by causing the film and the portion of the remaining conductive film 10A to react.

Figure 23:
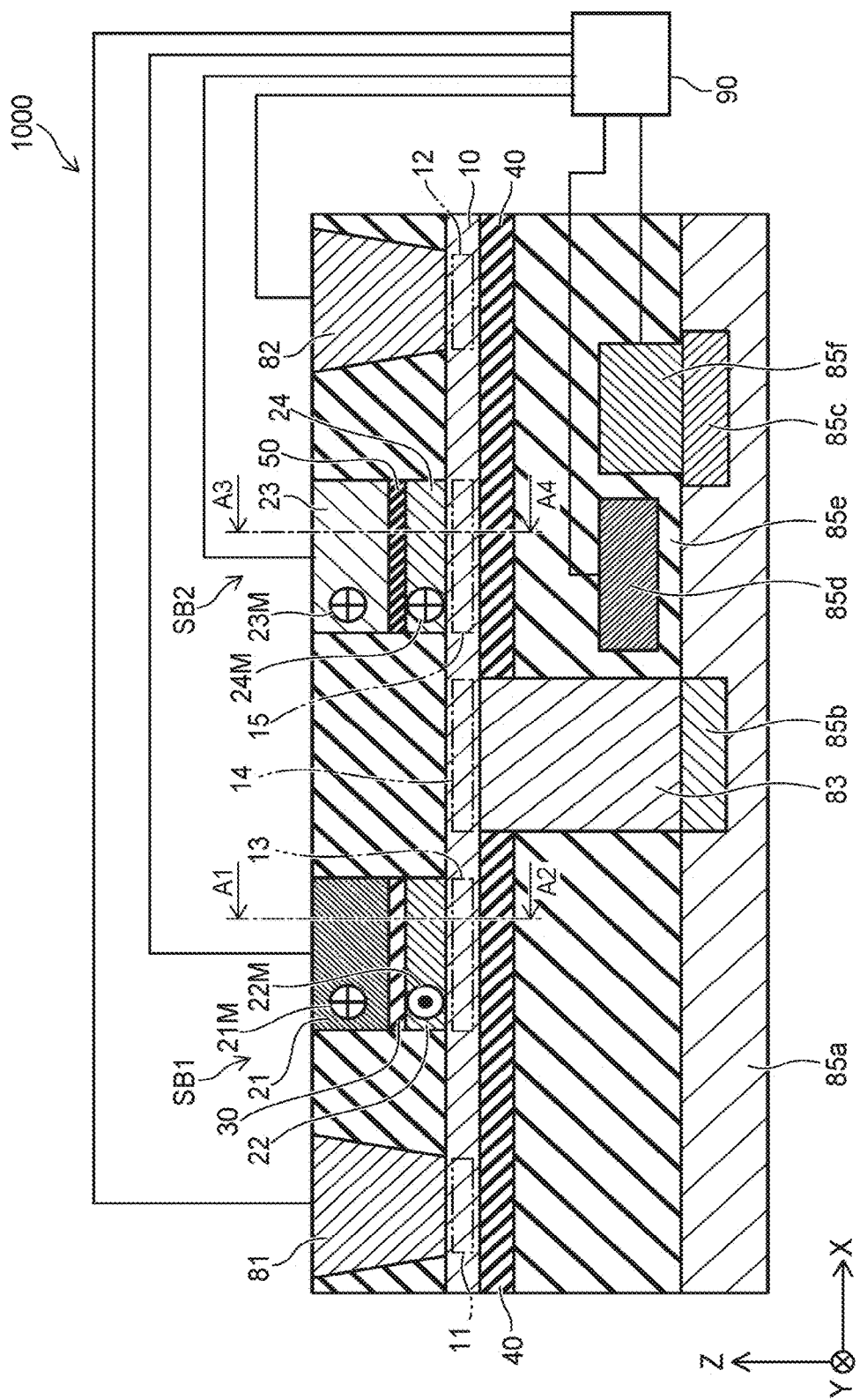
FIG. 23 is a cross-sectional view illustrating a magnetic memory device according to a tenth embodiment.

FIG. 23 is a cross-sectional view illustrating a magnetic memory device according to a tenth embodiment.

As shown in FIG. 23, the magnetic memory device 1000 includes the conductive layer 10, the first magnetic layer 21, the second magnetic layer 22, the third magnetic layer 23, the fourth magnetic layer 24, the first nonmagnetic layer 30, the first compound layer 40, the second nonmagnetic layer 50, a first electrode 81, a second electrode 82, a third electrode 83, a first semiconductor region 85a, a second semiconductor region 85b, a third semiconductor region 85c, an electrode 85d, an electrode 85e, and the controller 90.

The conductive layer 10 includes the first portion 11, the second portion 12, the third portion 13, the fourth portion 14, and the fifth portion 15. The third portion 13 is positioned between the first portion 11 and the second portion 12. The fourth portion 14 is positioned between the second portion 12 and the third portion 13. The fifth portion 15 is positioned between the second portion and the fourth portion 14.

The first electrode 81 is electrically connected with the first portion 11. The direction from the first portion 11 toward the first electrode 81 is aligned with the X-axis direction.

The third electrode 83 is electrically connected with the fourth portion 14. The direction from the third electrode 83 toward the fourth portion 14 is aligned with the Z-axis direction. For example, a position in the Z-axis direction of the conductive layer 10 is between a position in the Z-axis direction of the first electrode 81 and a position in the Z-axis direction of the third electrode 83 and between a position in the Z-axis direction of the second electrode 82 and a position in the Z-axis direction of the third electrode 83. For example, a portion of the third electrode 83 is provided between the first compound layers in the X-axis direction.

An orientation of a first magnetization 21M of the first magnetic layer 21 is, for example, aligned with the Y-axis direction. An orientation of a second magnetization 22M of the second magnetic layer 22 is, for example, aligned with the Y-axis direction. An orientation of a third magnetization 23M of the third magnetic layer 23 is, for example, aligned with the Y-axis direction. An orientation of a fourth magnetization 24M of the fourth magnetic layer 24 is, for example, aligned with the Y-axis direction.

The second semiconductor region 85b and the third semiconductor region 85c are separated from each other. The first semiconductor region 85a is provided around the second semiconductor region 85b and around the third semiconductor region 85c. The impurity concentration of the second semiconductor region 85b is higher than the impurity concentration of the first semiconductor region 85a. The impurity concentration of the third semiconductor region 85c is higher than the impurity concentration of the first semiconductor region 85a.

A portion of the first semiconductor region 85a is positioned between the second semiconductor region 85b and the third semiconductor region 85c. The insulating layer 85e is provided between the portion of the first semiconductor region and the electrode 85d. The third electrode 83 is electrically connected with the second semiconductor region 85b. The electrode 85f is electrically connected with the third semiconductor region 85c. The electrode functions as a gate electrode.

The controller is electrically connected with the first magnetic layer 21, the third magnetic layer 23, the first electrode 81, the second electrode 82, and the electrode 85f. The controller 90 is electrically connected with the third electrode 83 via a field effect transistor including the second semiconductor region 85b, the third semiconductor region 85c, and the electrode 85d.

In the A1-A2 line section view of the first stacked body SB1, each of the first magnetic layer 21, the second magnetic layer 22, and the first nonmagnetic layer 30, for example, curves as shown in FIG. 11. Each of the first magnetic layer 21, the second magnetic layer 22, and the first nonmagnetic layer 30 may curve similarly to one of the configurations shown in FIG. 13A to FIG. 13D and FIG. 14A to FIG. 14C.

For example, in the A3-A4 line section view of the second stacked body SB2, the third magnetic layer 23, the fourth magnetic layer 24, and the second nonmagnetic layer 50 respectively curve similarly to the first magnetic layer 21, the second magnetic layer 22, and the first nonmagnetic layer 30 as shown in FIG. 11. The fourth magnetic layer 24, and the second nonmagnetic layer 50 may respectively curve similarly to the first magnetic layer 21, the second magnetic layer 22, and the first nonmagnetic layer 30 as shown one of FIG. 13A to FIG. 13D and FIG. 14A to FIG. 14C.

Figure 24A:
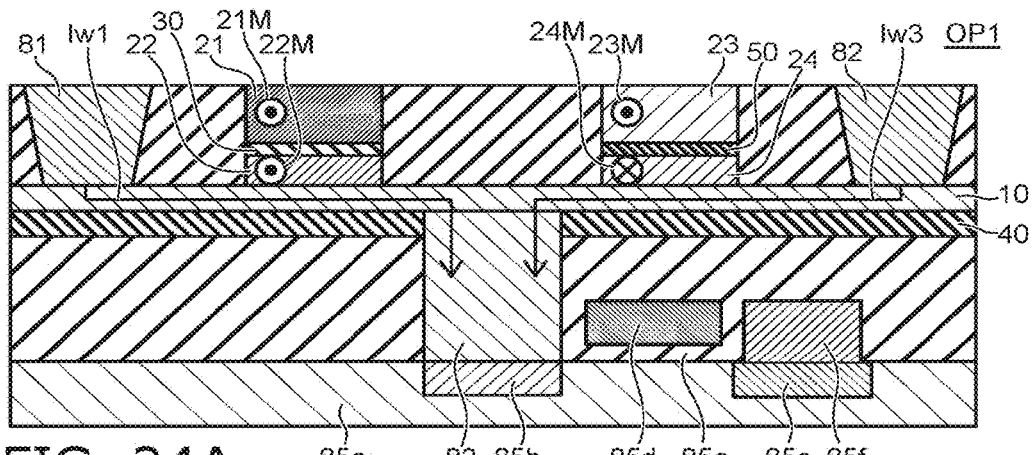
FIG. 24A to FIG. 24C are cross-sectional views illustrating an operation of the magnetic memory device according to the tenth embodiment.
Figure 24B:
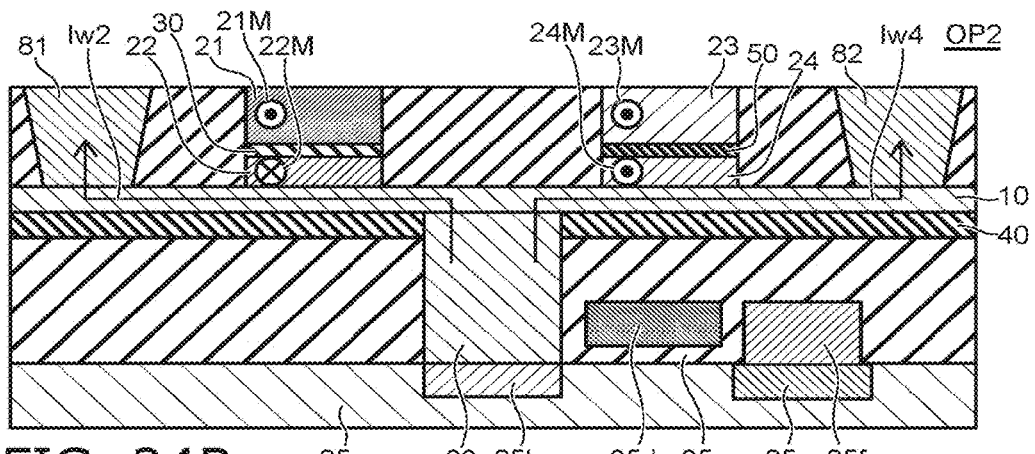
Figure 24C:
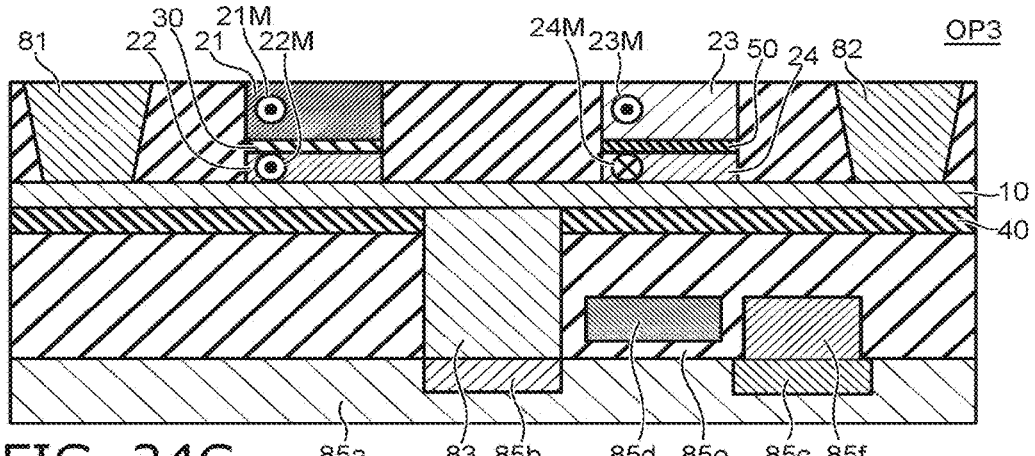

FIG. 24A to FIG. 24C are cross-sectional views illustrating an operation of the magnetic memory device according to the tenth embodiment.

The controller 90 is, for example, possible to implement the following operations.

In one operation OP1, a first current Iw1 flows from the first electrode 81 toward the third electrode 83 and a third current Iw3 flows from the second electrode 82 toward the third electrode 83 as shown in FIG. 24A. The orientation of the current (the first current Iw1) at the position of the first stacked body SB1 is opposite to the orientation of the current (the third current Iw3) at the position of the second stacked body SB2. In this operation OP1, the orientation of the spin hall torque interacting with the second magnetic layer 22 of the first stacked body SB1 is opposite to the orientation of the spin hall torque interacting with the fourth magnetic layer 24 of the second stacked body SB2.

In another operation OP2 shown in FIG. 24B, a second current Iw2 flows from the third electrode 83 toward the first electrode 81 and a fourth current Iw4 flows from the third electrode 83 toward the second electrode 82. The orientation of the current (the second current Iw2) at the position of the first stacked body SB1 is opposite to the orientation of the current (the fourth current Iw4) at the position of the second stacked body SB2. In this operation OP2, the orientation of the spin hall torque interacting with the second magnetic layer 22 of the first stacked body SB1 is opposite to the orientation of the spin hall torque interacting with the fourth magnetic layer 24 of the second stacked body SB2.

As shown in FIG. 24A and FIG. 24B, the orientation of the fourth magnetization 24M of the fourth magnetic layer 24 is opposite to the orientation of the second magnetization 22M of the second magnetic layer 22. The orientation of the third magnetization 23M of the third magnetic layer 23 is same as the orientation of the first magnetization 21M of the first magnetic layer 21. As described above, the first stacked body SB1 and the second stacked body SB2 store a plurality of magnetic information which the orientations are opposite to each other. For example, information (data) in the case where the operation OP1 is implemented corresponds to "1". For example, information (data) in the case where the operation OP2 is implemented corresponds to "0". For example, it is possible to read the magnetic information at high-speed, as described below, by implementing these operations.

In the operation OP1 and the operation OP2, the second magnetization 22M of the second magnetic layer 22 and spin currents of electrons (polarized electron) flowing in the conductive layer 10 interact with each other. The orientation of the second magnetization 22M and the orientation of the polarized electrons spin become the relation of being parallel or anti-parallel. The second magnetization 22M of the second magnetic layer 22 precesses and reverse. In the operation OP1 and the operation OP2, the orientation of the fourth magnetization 24M of the fourth magnetic layer 24 and the orientation of the polarized electrons spin become the relation of being parallel or anti-parallel. The fourth magnetization 24M of the fourth magnetic layer 24 precesses and reverse.

FIG. 24C illustrates the reading operation of the magnetic memory device 1000. In a reading operation OP3, an electric potential of the first magnetic layer 21 is taken as a fourth electric potential V4. An electric potential of the third magnetic layer 23 is taken as a fifth electric potential V5. The fourth electric potential V4 is, for example, ground potential. The difference of the electric potentials between the fourth electric potential V4 and the fifth electric potential V5 is taken as ΔV. Two electric resistances of each of the stacked bodies are respectively taken as a high resistance Rh and a low resistance Rl. The high resistance Rh is higher than the low resistance Rl. For example, the high resistance Rh corresponds to a resistance when the first magnetization 21M and the second magnetization 22M are anti-parallel. For example, the low resistance Rl corresponds to a resistance when the first magnetization 21M and the second magnetization 22M are parallel. For example, the high resistance Rh corresponds to a resistance when the third magnetization 23M and the fourth magnetization 24M are anti-parallel. For example, the low resistance Rl corresponds to a resistance when the third magnetization 23M and the fourth magnetization 24M are parallel. For example, in the operation OP1 ("1" state) shown in FIG. 24A, an electric potential Vr1 of the third electrode 83 is represented by the formula (1).

$$Vr1=\{R1/(R1+Rh)\} \times \Delta V \quad (1)$$

In the operation OP2 ("0" state) shown in FIG. 24B, an electric potential Vr2 of the third electrode 83 is represented by the formula (2).

$$Vr2=\{Rh/(R1+Rh)\} \times \Delta V \quad (2)$$

Thus, the potential change ΔVr between the "1" state and the "0" state is represented by the formula (3).

$$\Delta Vr=Vr2-Vr1=\{(Rh-R1)/(R1+Rh)\} \times \Delta V \quad (3)$$

The potential change ΔVr is, for example, obtained by measuring the electric potential of the third electrode 83.

By the reading operation OP3, for example, it is possible to reduce the consumption energy while reading compared to the case where a voltage (an electric potential difference) between two magnetic layers of a magnetoresistance element is measure by supplying a constant current to the stacked body (the magnetoresistance element). In the operation OP3, for example, it is possible to read at high speed. In the operation OP1 and the operation OP2, it is possible to control the perpendicular magnetic anisotropy of each of the second magnetic layer 22 and the fourth magnetic layer 24. Thereby, it is possible to reduce the writing current. For example, the writing current becomes almost half compared to the case where the writing is implemented without the control. For example, it is possible to reduce the electric charge for the writing. The relation between the polarizations of the voltages applied to the second magnetic layer 22 and the fourth magnetic layer 24 and the increase or decrease of the perpendicular magnetic anisotropy depends on the materials of the magnetic layers and the conductive layer 10.

In the above operation shown in FIG. 24C, the first electrode 81 and the second electrode 82 may be set to the same electric potential, the second magnetic layer 22 and the fourth magnetic layer 24 may be connected to an input terminal of a sense amplifier, and the difference of the electric potentials between the second magnetic layer 22 and the fourth magnetic layer 24 may be measured by the sense amplifier. One of the first electrode 81 and the second electrode 82 may be applied with a voltage, the other of the first electrode 81 and the second electrode 82 may be set at a floating potential. Or, currents may flow in the first electrode 81 and the second electrode 82 and the difference of the current value between at the second magnetic layer 22 and at the fourth magnetic layer 24 may be measured. Further, the first electrode 81 and the second electrode 82 may be set at the same electric potential, the second magnetic layer 22 and the fourth magnetic layer 24 may be connected to the input terminal of the sense amplifier, and the difference of the electric potentials between the second magnetic layer 22 and the fourth magnetic layer 24 may be measured by the sense amplifier. Further, the second magnetic layer 22 and the fourth magnetic layer 24 may be set at the same electric potential, the first electrode 81 and the second electrode 82 may be connected to the input terminal of the sense amplifier, and the difference of the electric potentials between the first electrode 81 and the second electrode 82 may be measured by the sense amplifier.

Figure 25:
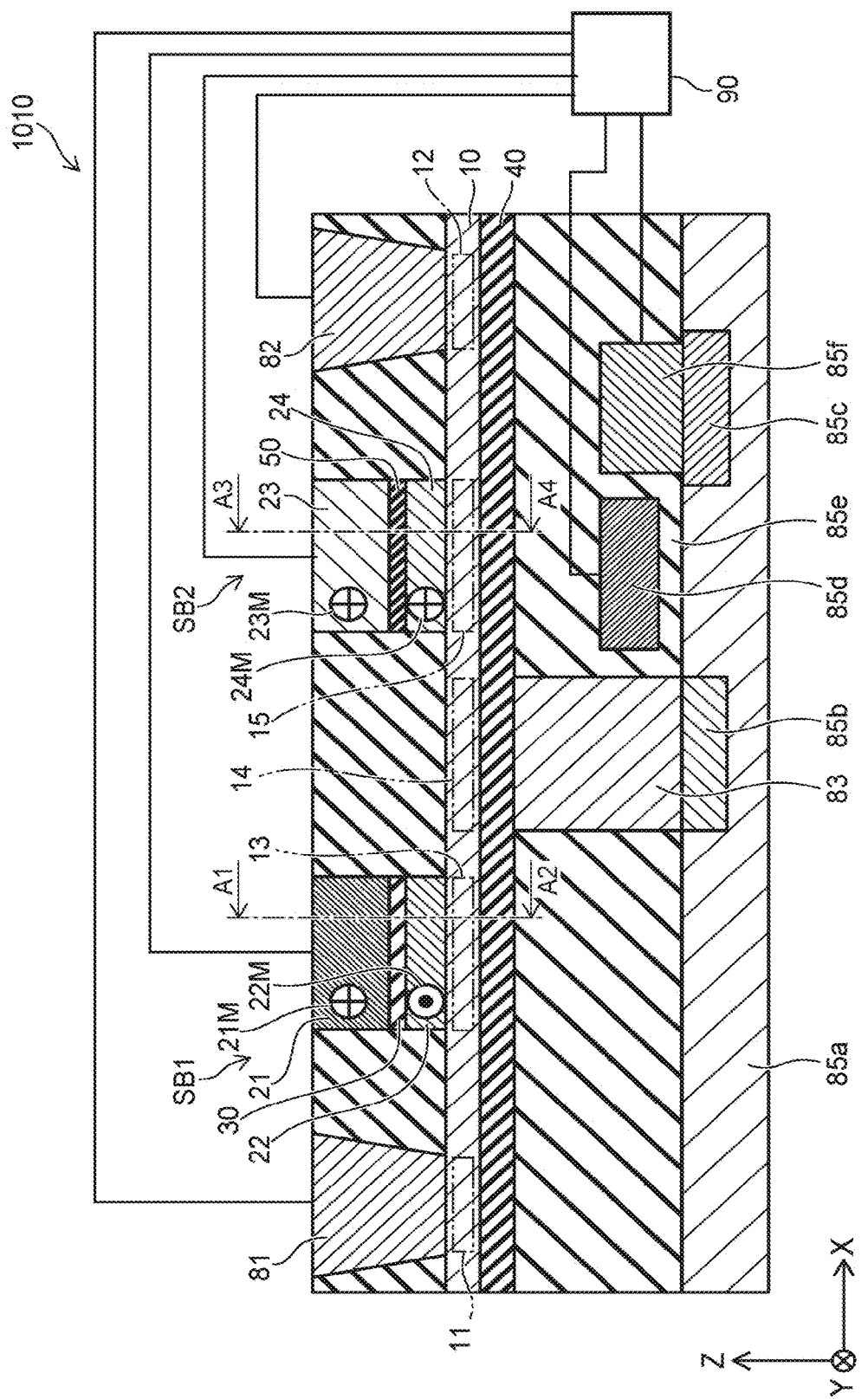
FIG. 25 is a cross-sectional view illustrating another magnetic memory device according to the tenth embodiment.

FIG. 25 is a cross-sectional view illustrating another magnetic memory device according to the tenth embodiment. In the magnetic memory device 1010 shown in FIG. 25, a portion of the first compound layer 40 is provided between the third electrode 83 and the conductive layer 10. It is possible to implement the operation OP1, operation OP2, and the operation OP3 described above on the magnetic memory device 1010.

According to the embodiments described above, the error rate in the program operation and the read operation of the magnetic memory device can be reduced. According to the embodiments, a magnetic memory device can be provided in which the operations can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory device such as the conductive layer, the first magnetic layer, the second magnetic layer, the first non-magnetic layer, the first compound layer, the second nonmagnetic layer, the second compound layer, the first insulating layer, the second insulating layer, the controller, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a conductive layer including a first portion, a second portion, and a third portion between the first portion and the second portion;
    a first magnetic layer separated from the third portion in a second direction crossing a first direction, the first direction being from the first portion toward the second portion;
    a second magnetic layer provided between the third portion and the first magnetic layer, the second magnetic layer being electrically connected with the third portion;
    a first nonmagnetic layer provided between the first magnetic layer and the second magnetic layer, the first nonmagnetic layer being curved; and
    a controller electrically connected to the first portion and the second portion,
    the controller implementing
        a first operation of supplying a first current to the conductive layer from the first portion toward the second portion, and
        a second operation of supplying a second current to the conductive layer from the second portion toward the first portion.

2. The device according to claim 1, wherein
the conductive layer further includes:
    a first partial region positioned between the first portion and the third portion, and
    a second partial region positioned between the second portion and the third portion,
    the first current flows in the first partial region and the second partial region in the first operation, and
    the second current flows in the first partial region and the second partial region in the second operation.

3. The device according to claim 1, further comprising a first compound layer,
    at least a portion of the third portion being provided between at least a portion of the second magnetic layer and at least a portion of the first compound layer in the second direction.

4. The device according to claim 3, wherein
the first compound layer is insulative, and
at least a portion of the first compound layer is provided between a portion of the first portion and a portion of the second portion in the first direction.

5. The device according to claim 3, further comprising a first layer, the first layer being conductive,
    the first compound layer being insulative,
    a direction from the first compound layer toward the first layer being aligned with the first direction.

6. The device according to claim 3, wherein the first compound layer includes an oxide of at least one element selected from the group consisting of aluminum, magnesium, tantalum, boron, calcium, silicon, germanium, gallium, indium, tungsten, titanium, copper, palladium, zirconium, yttrium, zinc, tin, and bismuth.

7. The device according to claim 1, further comprising a first compound layer,
    the conductive layer further including a fourth portion between the first portion and the third portion,
    a direction from the first compound layer toward the fourth portion being aligned with the second direction.

8. The device according to claim 7, wherein
the first compound layer is conductive, and
at least a portion of the first compound layer is provided between a portion of the first portion and a portion of the second portion in the first direction.

9. The device according to claim 7, wherein
a direction from a portion of the first compound layer toward the fourth portion is aligned with the second direction,
a direction from another portion of the first compound layer toward the second magnetic layer is aligned with the second direction, and
a length in the second direction of the portion of the first compound layer is longer than a length in the second direction of the other portion of the first compound layer.

10. The device according to claim 7, wherein the first compound layer includes at least one selected from the group consisting of zinc, indium, gallium, tin, bismuth, silicon, and manganese, iron, copper, aluminum, nickel, and cobalt.

11. The device according to claim 1, further comprising a first insulating layer,
    the first insulating layer including a first insulating region, a second insulating region, and a third insulating region,
    the second insulating region being separated from the first insulating region in the first direction,
    the first nonmagnetic layer being provided between the first insulating region and the second insulating region in the first direction,
    the first nonmagnetic layer being provided between the third insulating region and the second magnetic layer in the second direction.

12. The device according to claim 11, wherein the first insulating layer includes an oxide of at least one selected from the group consisting of aluminum, magnesium, boron, calcium, silicon, germanium, gallium, indium, tungsten, titanium, copper, palladium, zirconium, yttrium, zinc, tin, and bismuth.

13. The device according to claim 11, further comprising a second insulating layer,
    a portion of the first insulating region being provided between the first nonmagnetic layer and a portion of the second insulating layer in the first direction.

14. The device according to claim 13, wherein the second insulating layer includes an oxide of at least one selected from the group consisting of aluminum, magnesium, boron, calcium, silicon, germanium, gallium, indium, tungsten, titanium, copper, palladium, zirconium, yttrium, zinc, tin, and bismuth.

15. The device according to claim 1, further comprising:
a third magnetic layer separated from the first magnetic layer in the first direction;
a second nonmagnetic layer; and
a fourth magnetic layer,
the conductive layer further including a fifth portion between the second portion and the third portion,
the third magnetic layer being separated from the fifth portion in the second direction,
the fourth magnetic layer being provided between the fifth portion and the third magnetic layer,
the second nonmagnetic layer being provided between the third magnetic layer and the fourth magnetic layer,
a shape of the first nonmagnetic layer being different from a shape of the second nonmagnetic layer.

16. The device according to claim 15, further comprising:
a first compound layer; and
a second compound layer,
at least a portion of the third portion being provided between at least a portion of the second magnetic layer and at least a portion of the first compound layer in the second direction,
at least a portion of the fifth portion being provided between at least a portion of the fourth magnetic layer and at least a portion of the second compound layer in the second direction.

17. The device according to claim 1, further comprising a first compound layer,
the conductive layer further including a fourth portion between the first portion and the third portion,
a direction from the fourth portion toward the first compound layer being aligned with the second direction,
a position of the first compound layer in the second direction being between a position of the fourth portion in the second direction and a position of the first nonmagnetic layer in the second direction.

18. The device according to claim 3, wherein a length of the first compound layer in the first direction is longer than a length of the second magnetic layer in the first direction.

19. The device according to claim 1, further comprising a first compound layer, the first compound layer being insulative,
a direction from at least a portion of the conductive layer toward the first compound layer being aligned with a third direction crossing the first direction and the second direction.

20. The device according to claim 1, wherein
the first nonmagnetic layer includes a first nonmagnetic region, a second nonmagnetic region, and a third nonmagnetic region,
a position of the third nonmagnetic region in the first direction is between a position of the first nonmagnetic region in the first direction and a position of the second nonmagnetic region in the first direction, and
the third nonmagnetic region overlaps at least a portion of the first magnetic layer in the first direction.

21. The device according to claim 1, wherein
the first nonmagnetic layer includes a first nonmagnetic region, a second nonmagnetic region, and a third nonmagnetic region,
a position of the third nonmagnetic region in the first direction is between a position of the first nonmagnetic region in the first direction and a position of the second nonmagnetic region in the first direction, and
the third nonmagnetic region overlaps at least a portion of the second magnetic layer in the first direction.

22. The device according to claim 1, wherein
the first nonmagnetic layer includes a first nonmagnetic region, a second nonmagnetic region, and a third nonmagnetic region,
a position of the third nonmagnetic region in a third direction crossing the first direction and the second direction is between a position of the first nonmagnetic region in the third direction and a position of the second nonmagnetic region in the third direction, and
the third nonmagnetic region overlaps at least a portion of the first magnetic layer in the third direction.

23. The device according to claim 1, wherein
the first nonmagnetic layer includes a first nonmagnetic region, a second nonmagnetic region, and a third nonmagnetic region,
a position of the third nonmagnetic region in a third direction crossing the first direction and the second direction is between a position of the first nonmagnetic region in the third direction and a position of the second nonmagnetic region in the third direction, and
the third nonmagnetic region overlaps at least a portion of the second magnetic layer in the third direction.

24. A magnetic memory device, comprising:
a conductive layer including a first portion, a second portion, a third portion between the first portion and the second portion, a fourth portion between the second portion and the third portion, and a fifth portion between the second portion and the fourth portion;
a first magnetic layer separated from the third portion in a second direction crossing a first direction, the first direction being from the first portion toward the second portion;
a second magnetic layer provided between the third portion and the first magnetic layer;
a first nonmagnetic layer provided between the first magnetic layer and the second magnetic layer, the first nonmagnetic layer being curved;
a third magnetic layer separated from the fifth portion in the second direction;
a fourth magnetic layer provided between the fifth portion and the third magnetic layer;
a second nonmagnetic layer provided between the third magnetic layer and the fourth magnetic layer; and
a controller electrically connected to the first portion, the second portion, and the fourth portion,
the controller implementing
a first operation of supplying a first current to the conductive layer from the first portion toward the fourth portion, and
a second operation of supplying a second current to the conductive layer from the fourth portion toward the first portion.

25. The device according to claim 24, wherein
the controller supplying a third current to the conductive layer from the second portion toward the fourth portion in the first operation, and
the controller supplying a fourth current to the conductive layer from the fourth portion toward the second portion in the second operation.

* * * * *